United States Patent [19]

Tozawa

[11] Patent Number: 5,757,231
[45] Date of Patent: May 26, 1998

[54] FEED-FORWARD AMPLIFYING DEVICE AND BASE STATION WITH FEED-FORWARD AMPLIFYING DEVICE

[75] Inventor: Norio Tozawa, Kawasaki, Japan

[73] Assignee: Fujitsu Limited, Kawasaki, Japan

[21] Appl. No.: 661,386

[22] Filed: Jun. 11, 1996

[30] Foreign Application Priority Data

Nov. 16, 1995 [JP] Japan ................... 7-298763

[51] Int. Cl.$^6$ ................................ H03F 1/32
[52] U.S. Cl. ............... 330/151; 330/149; 375/297; 455/63
[58] Field of Search ................. 330/149, 151; 375/296, 297; 455/63, 89, 95

[56] References Cited

U.S. PATENT DOCUMENTS 4,617,522 10/1986 Tarbutton et al. ............ 330/151 X
5,065,110 11/1991 Ludvik et al. ................ 330/151 X

*Primary Examiner*—James B. Mullins
*Attorney, Agent, or Firm*—Staas & Halsey

[57] ABSTRACT

The present invention relates to a feed-forward amplifying device suitable for radio communications systems such as digital automobile telephones. The feed-forward amplifying device includes a distortion extracting loop circuit unit unit including a main amplifier which amplifies a main signal in a main signal system, the main amplifier having a first transistor and a first matching circuit arranged to at least one of the input side and the output side of the first transistor, the distortion extracting loop circuit unit generating a distortion extracted signal obtained by canceling a main signal component of an output from the main amplifier; and a distortion removing loop circuit unit including an auxiliary amplifier, with a passage delay time shorter than that of the main amplifier, which amplifies the distortion extracting signal from the distortion extracting loop circuit unit, the auxiliary amplifier including a second transistor with an output smaller than that of the first transistor and a second matching circuit arranged to at least one of the input side and the output side of the second transistor, the distortion removing loop circuit unit outputting only the main signal component from a signal in the main signal system at the rear stage of the main amplifier using the distortion extracted signal amplified by the auxiliary amplifier. The object of the invention is to improve the signal processing speed at a small power consumption and to realize a small, high-power feed-forward amplifying device.

56 Claims, 15 Drawing Sheets

FEED-FORWARD AMPLIFYING DEVICE AND BASE STATION WITH FEED-FORWARD AMPLIFYING DEVICE

BACKGROUND OF THE INVENTION

1) Field of the Invention

The present invention relates to a feed-forward amplifying device suitable for radio communication systems such as digital automobile telephones, and a base station with the feed-forward amplifying device.

2) Description of the Related Art

In radio equipment of a base station in a radio communication system such as a digital automobile telephone system, a multicarrier (a signal including plural frequency components selected every mobile unit at a working frequency band) is amplified in common for transmission to mobile units.

FIG. 12 is a block diagram showing a transmitter installed at a base station which accommodates plural mobile units in a radio communication system such as the digital automobile telephone system. Referring to FIG. 12, the transmitter 200 can amplify and transmit in common, for example, 12 kinds of frequency signals.

In the transmitter 200, numeral 201 represents a separating unit for separating transmitted signals every carrier wave; 201-1 to 202-12 represent direct modulating units which perform a modulation process every carrier wave separated and then convert the result into a high-frequency signal; and 203 represents a hybrid circuit (H) which combines signals from the direct modulating units 202-1 to 202-12.

Numeral 204 represents an amplifying device. The amplifying device 204 amplifies in common the transmitted signals as a multicarrier signal to be transmitted to mobile units 209 accommodated in the transmitter 200.

Numeral 207 represents a transmitting/receiving shared unit (DUP) which outputs the transmitted signal from the amplifying device 204 to an antenna 208. When a mobile unit 209 transmits a signal to the antenna 208, the signal is outputted to a receiving system (not shown) via the transmitting/receiving shared unit 207.

Thus, in the transmitter 200, shown in FIG. 12, the amplifying device 204 amplifies a multicarrier signal including twelve kinds of frequency components according to the signal power and then transmits the resultant signal.

In the radio equipment installed at a base station in the radio communication system, since it is required that the amplifying device 204 simultaneously amplifies the multicarrier signal in low noise, the feed-forward amplifying device 204 which performs a noise compensation in the feed-forward system is used.

FIG. 13 shows a circuit diagram of the feed-forward amplifying device 204. In the feed-forward amplifying device 204 shown in FIG. 13, a main amplifier 215 amplifies a main signal as a multicarrier signal from a main signal system and then outputs the result as an amplified signal. The main amplifier 215 is formed of a transistor and a matching circuit arranged to at least one of the input side and the output side of the transistor.

A main amplifier drive amplifier 214 which is arranged at the front stage (drive stage) of the main amplifier 215 amplifies secondarily an input signal to the main amplifier 215 to operate effectively the main amplifier 215. Like the main amplifier 215, the main amplifier drive amplifier 214 is formed of a transistor and a matching circuit connected to at least one of the input side and the output side of the transistor.

A DC/DC converter (voltage converter) 231 (to be described later) supplies electric power to the main amplifier 215 and the main amplifier drive amplifier 214.

Numeral 210 represents a distortion extracting loop circuit unit. The distortion extracting loop circuit unit 210 supplies the amplifying signal from the main amplifier 215 to the main signal system and creates a main signal cancelled signal with the same amplitude as that of the main signal in the main signal system and with a reversed phase. The distortion extracting loop circuit unit 210 extracts the distortion component of the main signal outputted from the main amplifier 215, using the main signal canceling signal.

The distortion extracting loop circuit unit 210 consists of a branching unit 211, a phase shifter 212, an attenuator 213, a distortion extracted signal outputting unit 216, and a delay line (first delay unit) 217, in addition to the main amplifier 215 and the main amplifier drive amplifier 214.

The branching unit 211 branches at the front stage the main signal which is to be inputted to the main amplifier 215. The phase shifter 212 varies the phase of a main signal being one of the signals blanched by the branching unit 211, based on control information from a control circuit 233. The attenuator 213 attenuates the main signal from the phase shifter 212, based on the control information from the control circuit 233.

That is, in order to convert the signal outputted from the distortion extracted signal outputting unit 216 into a distortion extracted signal of which the main signal component is suitably canceled, the phase shifter 212 performs a variable phase control and the attenuator 213 performs a variable amplitude control.

The delay line 217 delays the other main signal branched by the branching unit 211 by a predetermined time, in consideration of the passing time in the phase shifter 212, the attenuator 213, the main amplifier drive amplifier 214, and the main amplifier 215, and then outputs the delayed signal to the distortion extracted signal outputting unit 216.

Moreover, the distortion extracted signal outputting unit 216 is arranged behind the main amplifier 215. The distortion extracted signal outputting unit 216 attenuates the main signal amplified by the main amplifier 215 to the original level before the amplifying operation, synthesizes the attenuated signal with the main signal from the delay line 217, then outputs the resultant signal acting as a distortion extracted signal to a distortion removing loop circuit 220 (to be described later), together with the signal from the main amplifier 215.

The distortion removing loop circuit 220 which is arranged behind the main amplifier 215 outputs the main signal component of a signal in the main signal system at the rear stage of the main amplifier 215, using a distortion extracted signal obtained by canceling the main signal component of the output signal from the main amplifier 215. The distortion removing loop circuit 220 includes a phase shifter 222, an attenuator 223, an auxiliary amplifier drive amplifier 224, an auxiliary amplifier 225, a distortion component removing unit 226, and a delay line (second delay line) 227. Numeral 232 represents a termination which matches the impedance.

The phase shifter 222 varies the phase of the distortion extracted signal from the distortion extracted signal outputting unit 216 according to the control information from the control circuit 233. The attenuator 223 varies the amplitude of the distortion extracting signal from the distortion extracted signal outputting unit 216 based on the control information from the control circuit 233.

The auxiliary amplifier drive amplifier 224 which are arranged in front of the auxiliary amplifier (drive stage) 225 amplifies secondarily the inputted signal to the auxiliary amplifier 225 to operate effectively the auxiliary amplifier 225. Like the main amplifier drive amplifier 214 and the main amplifier 215, the auxiliary amplifier drive amplifier 224 consists of the transistor and a matching circuit arranged to at least one of the input side and the output side thereof.

The auxiliary amplifier 225 amplifies the distortion extracting signal inputted from the auxiliary amplifier drive amplifier 224 with a desired amplification rate. Like the main amplifier drive amplifier 214, the main amplifier 215, and the auxiliary amplifier drive amplifier 224, the auxiliary amplifier 225 consists of the transistor and a matching circuit arranged to the input side or output side thereof.

Like the main amplifier 215 and the main amplifier drive amplifier 214 described above, the DC/DC converter (voltage converter) 231 (to be described later) supplies electric power to the auxiliary amplifier 225 and the auxiliary amplifier drive amplifier 224.

The delay line 227 receives the main signal from the main amplifier 215 and the distortion component generated in the main amplifier 215 and then delays them by a predetermined time, in consideration of the passing time in which they pass through the auxiliary amplifier drive amplifier 224 and the auxiliary amplifier 225.

The distortion component removing unit 226 synthesizes the signal from the delay line 227 with the amplified signal from the auxiliary amplifier 225. Thus, only the main signal component can be outputted by canceling the distortion components generated in the main amplifier 215 being the components other than the main signal component.

Numeral 230 represents a power supply unit (primary power source). Numeral 231 represents a DC/DC converter (voltage converter). The power supply unit 230 which provides a kind of power source voltage, as shown in FIG. 13, supplies electric power to the main amplifier drive amplifier 214, the auxiliary amplifier drive amplifier 224, and the auxiliary amplifier 225 via the DC/DC converter 231.

In the feed-forward amplifying device 204 having the above-mentioned configuration shown in FIG. 13, the distortion extracting loop circuit unit 210 receives a multicarrier signal acting as a main signal and then outputs a distortion extracted signal to minimize the canceled main signal component. On the other hand, the distortion removing loop circuit unit 220 ouputs the main signal with the minimum distortion signal component cancelled.

In the feed-forward amplifying device 204 shown in FIG. 13, a bipolar transistor, enhancement-mode MOSFET (Metal Oxide Semiconductor Field Effect Transistor), or depletion-mode GaAs FET (GaAs Field Effect Transistor) can be used for the transistor in the main amplifier drive amplifier 214, the main amplifier 215, the auxiliary amplifier drive amplifier 224, or auxiliary amplifier 225.

The bipolar transistor, MOSFET, and GaAs FET have a different bias voltage, respectively. Hence, in the feed-forward amplifying device 204 shown in FIG. 13, the main amplifier drive amplifier 214, the main amplifier 215, the auxiliary amplifier drive amplifier 224, and the auxiliary amplifier 225 are formed of the same type of transistors (that is, bipolar transistors, MOSFETs or GaAs FETs).

The bipolar transistor or MOSFET is, for example, a transistor which can provide an output power of 80 to 150 W alone housed in a 20 mm×20 mm×5 mm package in a quasi-microwave band. Hence, the slimmed, high-power feed-forward amplifying device 204 can be built inexpensively using such bipolar transistors or MOSFETs.

The GaAs FET is a transistor with a short delay time of the main signal which passes through the amplifier, compared with the MOSFET with the same output power. Using the GaAs FET allows the feed-forward amplifying device 204 to include shorter delay lines 217 and 227.

However, in the feed-forward amplifying device 204 using the bipolar transistors or MOSFETs, the increased signal transmission loss in the delay lines 217 and 227 leads to the increased operation level of the main amplifier drive amplifier 214 and the main amplifier 215. Hence, there is the disadvantage in that the power consumption of the feed-forward amplifying device 204 increases.

Moreover, since the GaAs FET provides the maximum output power of 30 W per element in a package as large as that of the MOSFET, plural GaAs FETs must be arranged for the main amplifier 215 to obtain the output power of 100 W or more (e.g. four or more elements arranged in parallel are needed). Hence, there is the disadvantage in that the use of the GaAs FETs makes it difficult to realize the slimmed feed-forward amplifying device 204.

That is, the small, high-power feed-forward amplifying device 204 can be built inexpensively by forming all the amplifiers using the bipolar transistors or MOSFETs. However, the power consumption of the feed-forward amplifying device 204 increases.

Moreover, the feed-forward amplifying device 204 with shorter delay lines 217 and 227 can be built by forming all the amplifiers using the GaAs FETs. However, it is difficult to built the small feed-forward amplifying device 204.

SUMMARY OF THE INVENTION

The present invention is made to overcome the above mentioned antinomic problems. An object of the present invention is to provide a small, high-output power feed-forward amplifying device that can perform a high-speed signal processing with a small power consumption by using various kinds, not a single kind, of transistors to make full use of the feature of each transistor and by configuring the feed-forward amplifying device in a simplified circuit form.

Another object of the present invention is to provide a base station with a feed-forward amplifying device that can perform a high-speed signal processing with a small power consumption by using various kinds, not a single kind, of transistors to make full use of the feature of each transistor and by configuring the base station in a simplified circuit form.

In order to achieve the above objects, according to the present invention, the feed-forward amplifying device is characterized by a distortion extracting loop circuit unit unit including a main amplifier which amplifies a main signal in a main signal system, the main amplifier including a first transistor and a first matching circuit arranged it at least one of the input side and the output side of the first transistor, the distortion extracting loop circuit unit unit creating a distortion extracted signal obtained by canceling the main signal component of an output signal from the main amplifier; and a distortion removing loop circuit unit including an auxiliary amplifier which provides a passage delay time shorter than that of the main amplifier and amplifies the distortion extracted signal from the distortion extracting loop circuit unit, the auxiliary amplifier including a second transistor with an output smaller than that of the first transistor alone and a second matching circuit arranged at at least one of the input side and the output side of the second transistor, the distortion removing loop circuit unit outputting only the main signal component from the signals in the main signal system at the rear stage of the main amplifier using the distortion extracted signal amplified by the auxiliary amplifier.

Hence, according to the present invention, there is the advantage in that a small, high-power feed-forward amplifying device can be easily realized at a low power consumption.

According to the present invention, the feed-forward amplifying device is characterized by a distortion extracting loop circuit unit unit including a branching unit for branching a main signal in a main signal system, a main amplifier for amplifying the main signal branched by the branching unit, the main amplifier formed of a first transistor and a first matching circuit arranged to at least one of the input side and output side of the first transistor, a first delaying unit for delaying the other main signal branched in the branching unit to different side from the main amplifier side, and a distortion extracted signal outputting unit for synthesizing a signal from the first delaying unit with a signal from the main amplifier and then producing the result as a distortion extracted signal; and a distortion removing loop circuit unit including a second delaying unit for delaying the signal amplified by the main amplifier, an auxiliary amplifier, with a passage delay time shorter than that of the main amplifier, for amplifying the distortion extracted signal from the distortion extracted signal outputting unit, the auxiliary amplifier including a second transistor with an output smaller than that of the first transistor alone and a second matching circuit arranged to at least one of the input side and the output side of the second transistor, and a distortion component removing unit for synthesizing a signal from the auxiliary amplifier with a signal from the second delaying unit and then removing the result as a main signal of which the distortion component is removed.

Hence, according to the present invention, there is the advantage in that a small, high-power feed-forward amplifying device can be easily realized with a low power consumption.

Moreover, the feed-forward amplifying device according to the present invention is characterized in that the first transistor is formed of a bipolar transistor or a MOSFET; and the second transistor is formed of a GaAs FET.

Hence, there is the advantage in that a small, high-power feed-forward amplifying device can be easily realized with a low power consumption.

In the feed-forward amplifying device according to the present invention, the auxiliary amplifier may be formed as a balanced-type amplifier using a hybrid.

Hence, the feed-forward amplifying device according to the present invention has the advantage in that the amplification accuracy can be improved by suppressing the ripple in the distortion removing unit with a low delaying operation.

Furthermore, the feed-forward amplifying device according to the present invention is further characterized by a first voltage converter for converting a voltage of a primary power source into a voltage suitable for the main amplifier to provide a bias power source for the main amplifier and a second voltage converter for converting a voltage of the primary power source into a voltage suitable for the auxiliary amplifier to provide a bias power source for the auxiliary amplifier.

Hence, the present invention has the advantage in that a high-performance feed-forward amplifying device can be configured by using two kinds of amplifiers with different bias voltages.

The feed-forward amplifying device according to the present invention is further characterized by a primary power source for supplying a voltage suitable for the main amplifier to provide a bias power source for the main amplifier and a voltage converter for converting a voltage of the primary power source into a voltage suitable for the auxiliary amplifier to provide a bias power supply unit for the auxiliary amplifier.

Hence, the present invention has the advantage in that the feed-forward amplifying device can be easily slimmed because the voltage converter for the main amplifier is removed and can be easily reduced in its power consumption because the conversion loss of the voltage converter can be eliminated.

Furthermore, the feed-forward amplifying device according to the present invention is further characterized by a main amplifier drive amplifier arranged in the front stage of the main amplifier, the main amplifier drive amplifier including a third transistor and a third matching circuit arranged to at least one of the input side and output side of the third transistor.

Hence, the feed-forward amplifying device with above-mentioned configuration according to the present invention has the advantage in that the main amplifier can be effectively operated.

The feed-forward amplifying device according to the present invention may be characterized in that the third transistor is a GaAs FET. Hence, the feed-forward amplifying device has the advantage in that the signal delay time can be shortened.

Moreover, the feed-forward amplifying device according to the present invention is further characterized by an auxiliary amplifier drive amplifier arranged in the front stage of the auxiliary amplifier and formed of a fourth transistor of the same type as the third transistor and a fourth matching circuit arranged at at least one of the input side and output side of the fourth transistor.

Hence, since an auxiliary amplifier drive amplifier is arranged in the front stage of the auxiliary amplifier and formed of the fourth transistor of the same type as the third transistor and the fourth matching circuit arranged to at least one of the input side and output side of the fourth transistor, the feed-forward amplifying device according to the present invention has the advantage in that the auxiliary amplifier can be effectively operated.

The feed-forward amplifying device according to the present invention is characterized in that the fourth transistor is formed of a GaAs FET. Hence, the feed-forward amplifying device according to the present invention has the advantage in that the signal delay time can be shortened.

The feed-forward amplifying device according to the present invention may be characterized in that the auxiliary amplifier drive amplifier is formed as a variable gain type amplifier. Hence, the feed-forward amplifying device according to the present invention has the advantage in that the gain due to temperature changes the auxiliary amplifier can be corrected.

The feed-forward amplifying device according to the present invention is further characterized by a first voltage converter for converting a voltage from a primary power source into a voltage suitable for the main amplifier and the main amplifier drive amplifier to provide a bias power source for the main amplifier and the main amplifier drive amplifier, and a second voltage converter for converting a voltage from the primary power source into a voltage suitable for the auxiliary amplifier and the auxiliary amplifier drive amplifier to provide a bias power source for the auxiliary amplifier and the auxiliary amplifier drive amplifier.

Hence, according to the present invention, a high-performance feed-forward amplifying device can be configured by using two kinds of amplifiers with different bias voltages.

Furthermore, the feed-forward amplifying device according to the present invention is further characterized by a first voltage converter for converting a voltage from a primary power source into a voltage suitable for the main amplifier to provide a bias power source for the main amplifier, and a second voltage converter for converting a voltage from the primary power source into a voltage suitable for the auxiliary amplifier, the main amplifier drive amplifier and the auxiliary amplifier drive amplifier to provide a bias power source for the auxiliary amplifier, the main amplifier drive amplifier and the auxiliary amplifier drive amplifier.

Hence, according to the present invention, a small, high-power feed-forward amplifying device can be easily realized with a low power consumption.

The feed-forward amplifying device according to the present invention is further characterized by a primary power source for supplying a voltage suitable for the main amplifier and the main amplifier drive amplifier to provide a bias power source for the main amplifier and the main amplifier drive amplifier; and a voltage converter for converting a voltage from the primary power source into a voltage suitable for the auxiliary amplifier and the auxiliary amplifier drive amplifier to provide a bias power source for the auxiliary amplifier and the auxiliary amplifier drive amplifier.

Hence, the present invention has the advantage in that the feed-forward amplifying device can be easily slimmed because the voltage converter for the main amplifier is removed and can be easily reduced in its power consumption because the conversion loss of the voltage converter can be eliminated.

Furthermore, the feed-forward amplifying device according to the present invention is further characterized by a primary power source for supplying a voltage suitable for the main amplifier to provide a bias power source for the main amplifier; and a voltage converter for converting a voltage of the primary power source into a voltage suitable for the auxiliary amplifier, the main amplifier drive amplifier and the auxiliary amplifier drive amplifier to provide a bias power source for the auxiliary amplifier, the main amplifier drive amplifier and the auxiliary amplifier drive amplifier.

Hence, the present invention has the advantage in that the feed-forward amplifying device can be easily slimmed because the voltage converter for the main amplifier is removed and can be easily reduced in its power consumption because the conversion loss of the voltage converter can be eliminated.

According to the present invention, the base station including a feed-forward amplifying device, the base station accommodating plural mobile stations, is characterized by a transmitting unit for amplifying and transmitting in common a signal including plural frequency components selected for each mobile station, in a frequency band used for transmitting signals to the mobile stations; the transmitting unit including a distortion extracting loop circuit unit unit including a main amplifier which amplifies a main signal in a main signal system, the main amplifier including a first transistor and a first matching circuit arranged at at least one of the input side and the output side of the first transistor, the distortion extracting loop circuit unit unit creating a distortion extracted signal obtained by canceling the main signal component of an output from the main amplifier; and a distortion removing loop circuit unit including an auxiliary amplifier, with a passage delay time shorter than that of the main amplifier, which amplifies the distortion extracted signal from the distortion extracting loop circuit unit, the auxiliary amplifier including a second transistor which provides an output smaller than that of the first transistor alone and a second matching circuit arranged at at least one of the input side and the output side of the second transistor, the distortion removing loop circuit unit producing only the main signal component from the signal in the main signal system at the rear stage of the main amplifier using the distortion extracted signal amplified by the auxiliary amplifier.

Hence, the present invention has the advantage in that a high-performance base station with a feed-forward amplifying device can be easily installed by providing a small, high-power feed-forward amplifying device operated with low power consumption.

DESCRIPTION OF THE PREFERRED EMBODIMENTS

The embodiments of the present invention will be explained below by referring to the attached drawings.

Figure 1:
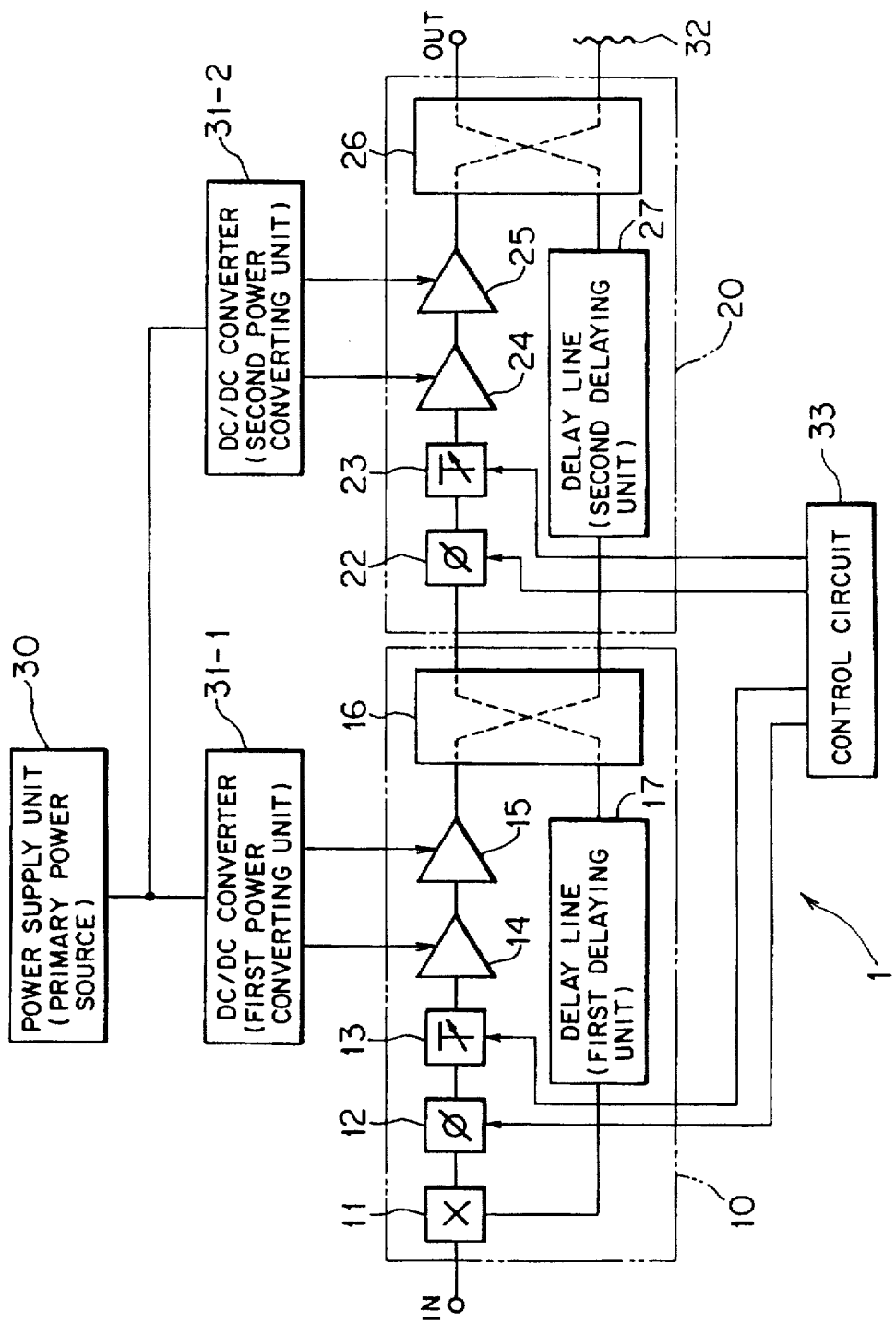
FIG. 1 is a block diagram showing the configuration of a feed-forward amplifying device according to the first embodiment of the present invention.
Figure 12:
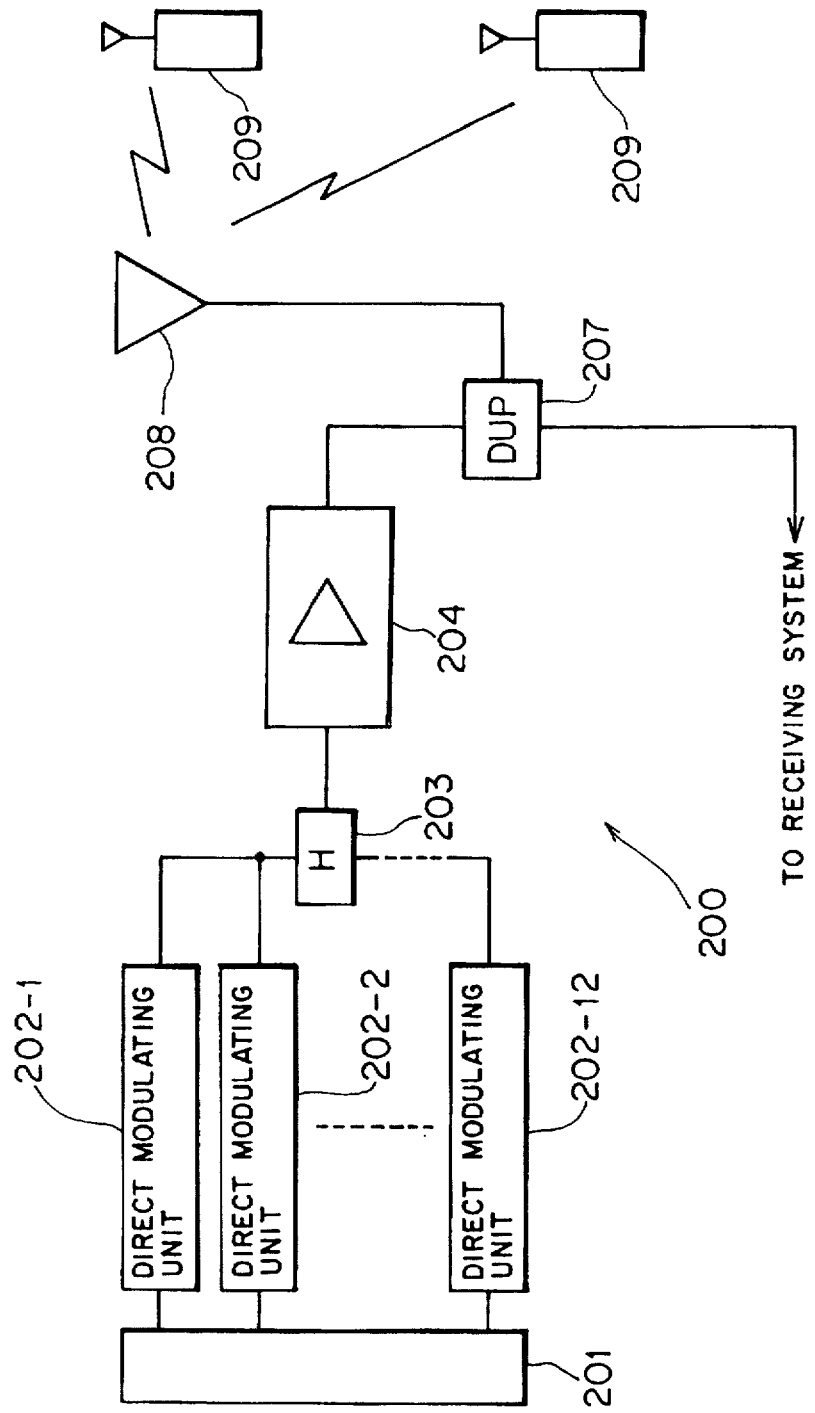
FIG. 12 is a block diagram illustrating the configuration of a transmitting device equipped in a base station.

(a) First Embodiment:

FIG. 1 is a block diagram showing a feed-forward amplifying device according to the first embodiment of the present invention. The feed-forward amplifying device 1 shown in FIG. 1 can be applied as an amplifying device installed at a base station accommodating plural mobile units in the radio communication system such as a digital automobile telephone system shown in FIG. 12 and can amplify in common as a multicarrier signal the transmission signal to each mobile unit 209.

In the multicarrier system in which plural calls (traffic) can be simultaneously transmitted, the number of carriers is controlled according to the call.

The main amplifier 15, shown in FIG. 1, amplifies a main signal acting as a multicarrier signal from a main signal system and outputs the signal as an amplified signal. The main amplifier 15 is formed of a first transistor and a first matching circuit arranged to one of the input side and output side of the first transistor. A bipolar transistor or enhancement-mode MOSFET (Metal Oxide Semiconductor Field Effect Transistor) being a high power transistor with a long delay time is used as the first transistor.

In order to operate effectively the main amplifier 15, the main amplifier drive amplifier 14 which secondarily amplifies an input signal to be sent to the main amplifier 15 is arranged at the front stage (drive stage) of the main amplifier 15. The main amplifier drive amplifier 14 is formed of a third transistor and a third matching circuit which is arranged at one of the input side and output side of the third transistor. In the feed-forward amplifying device 1 according to the present embodiment, the third transistor is formed of a bipolar transistor or enhancement-mode MOSFET being a high power transistor with a long delay time, like the first transistor.

A DC/DC converter (first voltage converter) 31-1 (to be described later) supplies electric power to the main amplifier 15 and the main amplifier drive amplifier 14.

The main amplifier 15 and the main amplifier drive amplifier 14 will be explained below with reference to FIGS. 8 and 9.

The main amplifier 15 and the main amplifier drive amplifier 14 will be explained by referring to FIGS. 8 and 9.

Figure 8:
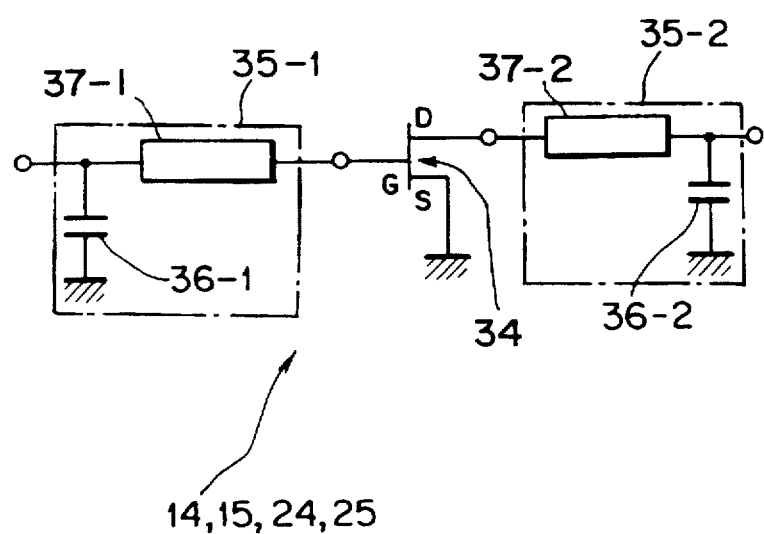
FIG. 8 is a block diagram illustrating the configuration of an amplifier with a MOSFET.

FIG. 8 is a circuit structural diagram showing the main amplifier 15 or the main amplifier drive amplifier 14 using a MOSFET 34 acting as the first transistor or third transistor. FIG. 9 is a circuit structural diagram showing the main amplifier 15 or the main amplifier drive amplifier 14 using a bipolar transistor 34' acting as the first transistor or third transistor.

Figure 9:
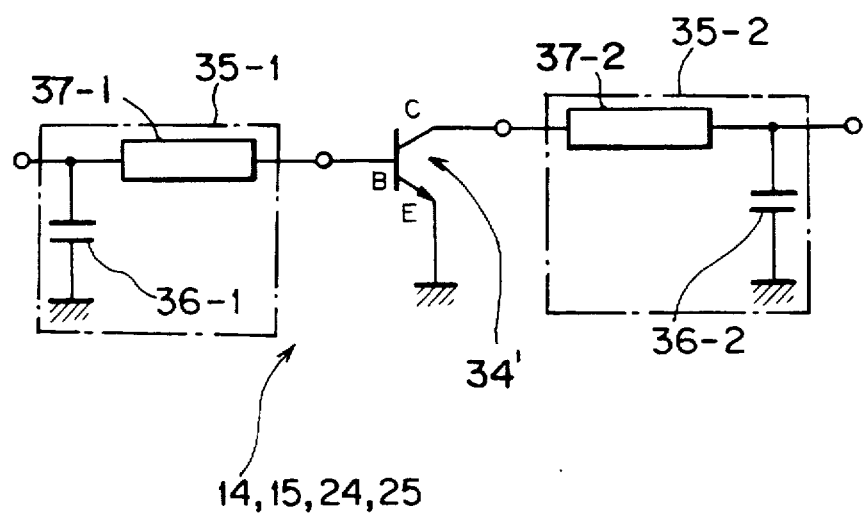
FIG. 9 is a block diagram illustrating the configuration of an amplifier with a bipolar transistor.

In the main amplifier 15 and the main amplifier drive amplifier 14 shown in FIGS. 8 and 9, the source of the MOSFET 34 is grounded and the emitter of the bipolar transistor 34' is grounded.

In order to attenuate undesired waves such as harmonics, a matching circuit 35-1 is arranged to the input side of the MOSFET 34 or the bipolar transistor 34' and a matching circuit 35-2 is arranged to the output side of the MOSFET 34 or the bipolar transistor 34'. The low-pass matching circuit with a capacitor connected in parallel is used as each of the matching circuits 35-1 and 35-2 in order to simplify the gain adjustment. Numerals 36-1 and 36-2 represent a capacitor and numerals 37-1 and 37-2 represent a line, respectively.

The bipolar transistor or MOSFET is a transistor which can provide an output power of 80 to 150 W per device in the quasi-microwave band. According to the present embodiment, a small, high power feed-forward amplifying device 1 can be realized by forming the main amplifier 15 and the main amplifier drive amplifier with bipolar transistors or MOSFETs.

Moreover, the transistor acting as a signal amplifying device includes a depletion-mode GaAs FET, in addition to the bipolar transistor and the enhancement-mode MOSFET. The GaAs FET provides a smaller output power alone and a different bias voltage, compared with the bipolar transistor and the enhancement-mode MOSFET. However, this GaAs FET has a shorter delay time.

Figure 2:
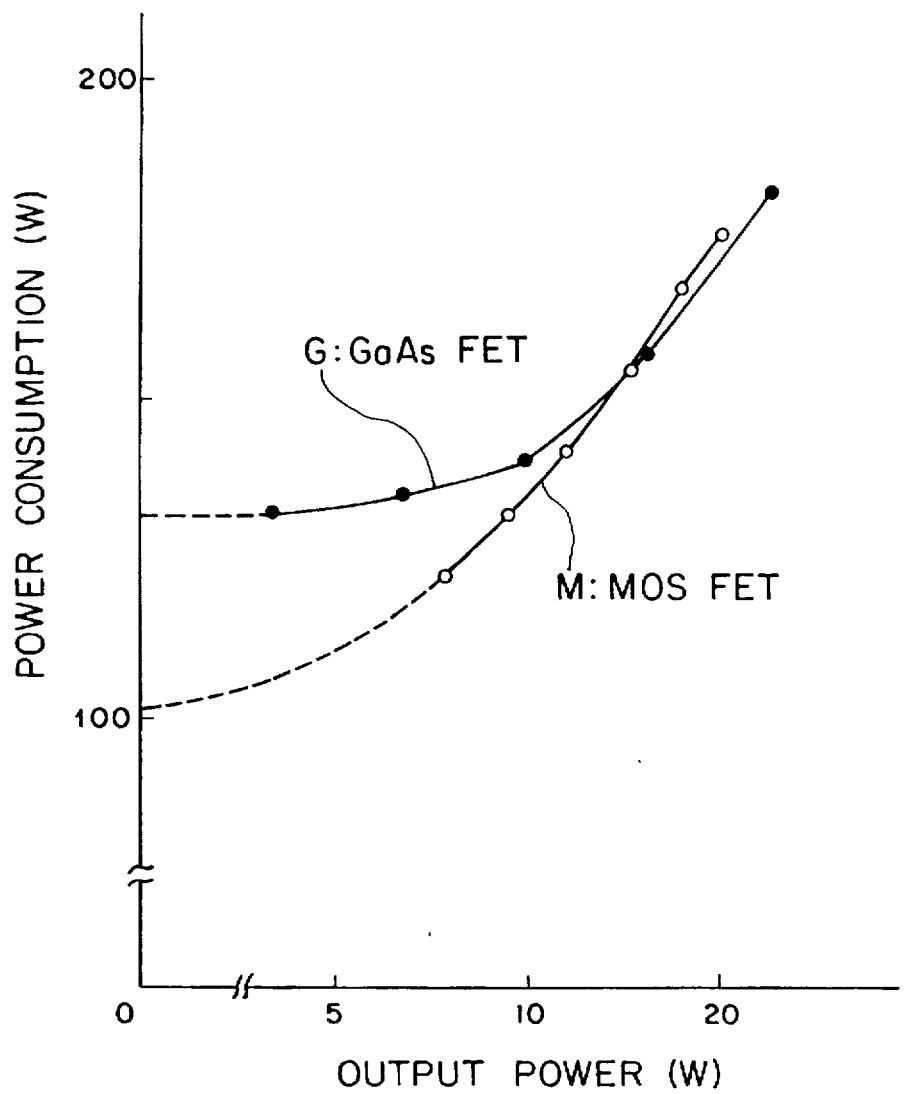
FIG. 2 is a block diagram used for explaining the operation of the feed-forward amplifying device according to the first embodiment of the present invention.

FIG. 2 shows the relationship between output power and power consumption in a MOSFET and GaAs FET. In FIG. 2, the letter M stands for the MOSFET and G stands for the GaAs FET.

For example, compared with the GaAs FET biased so as to be the Class AB, the bipolar transistor or MOSFET biased so as to operate as the Class AB provides a large change in power consumption with respect to an input power variation.

In concrete terms, with the output power of 20 W, for example, as shown in FIG. 2, the power consumption of the MOSFET is nearly the same as that of the GaAs FET. However, where the power consumption is equal to or less than 5 W, that is, the main signal is not inputted or has a small amplitude, the power consumption of the MOSFET is smaller than that of the GaAs FET by about 30 W.

Hence, as described above, according to the present embodiment, a small, high-power feed-forward amplifying device 1 can be realized by forming the main amplifier 15 with a bipolar transistor or MOSFET. Moreover, the feed-forward amplifying device 1 can operate with low power consumption when there are nearly no calls, for example, at midnight.

In the feed-forward amplifying device 1 shown in FIG. 1, numeral 10 represents a distortion extracting loop circuit unit unit. The distortion extracting loop circuit unit unit 10 creates a distortion extracted signal obtained by canceling the main signal component of the output of the main amplifier 15. The distortion extracting loop circuit unit unit 10 supplies an amplification signal from the main amplifier 15 to the main signal system via a distortion extracted signal outputting unit 16 arranged at the rear stage side of the main amplifier 15 and creates a main signal cancelled signal of which the amplitude is the same as that of the main signal in the main signal system and of which the phase is reversed, and then extracts the distortion component of the main signal outputted from the main amplifier 15 using the main signal canceled signal.

Moreover, the distortion extracting loop circuit unit unit 10 consists of the branching unit 11, the phase shifter 12, the attenuator 13, and the delay line (first delay unit) 17, in addition to the main amplifier drive amplifier 14, the main amplifier 15, and the distortion extracted signal outputting unit 16.

The branching unit 11 branches the signal at the front stage of the main signal in the main signal system to be inputted to the main amplifier 15. The phase shifter 12 varies the phase of the main signal from the branching unit 11 according to the control information from a control circuit 33.

The attenuator 13 attenuates the main signal from the phase shifter 12 according to the control information from the control circuit 33.

That is, the phase shifter 12 executes a variable phase control to convert the signal outputted from the distortion extracted signal outputting unit 16 into a distortion extracting signal of which the main signal component is cancelled most suitably. The attenuator 13 executes a variable amplitude control to convert the signal outputted from the distortion extracted signal outputting unit 16 into a distortion extracting signal of which the main signal component is cancelled most suitably.

The delay line 17 delays the main signal blanched differently from the main amplifier side (or the other main signal branched in the branching unit 11) by a predetermined time, decided in consideration of the time passing through the phase shifter 12, the attenuator 13, the main amplifier drive amplifier 14 and the main amplifier 15, and then outputs the delayed signal to the distortion extracted signal outputting unit 16.

The distortion extracted signal outputting unit 16 outputs a distortion extracting signal by synthesizing the signal from the delay line 17 with the signal from the main amplifier 15. The distortion extracted signal outputting unit 16 attenuates the main signal amplified by the main amplifier 15 to the original level; synthesizes the resultant signal with the main signal from the delay line 17; and then outputs the result acting as a distortion extracted signal to the distortion removing loop circuit unit 20, together with the signal from the main amplifier 15.

In FIG. 1, numeral 25 represents an auxiliary amplifier. The auxiliary amplifier 25 is an amplifier which amplifies the distortion extracted signal from the distortion extracting loop circuit unit unit 10 at a desired amplification rate and has a passage delay time shorter than the main amplifier 15. The auxiliary amplifier 25 is formed of a second transistor and a second matching circuit provided to at least one of the input side and the output side of the second transistor. A depletion-mode GaAs FET which provides a smaller output power alone and has its different bias voltage and its shorter delay time than that of the first transistor forming the main amplifier 15 may be used as the second transistor.

In order to efficiently operates the auxiliary amplifier 25, the auxiliary amplifier drive amplifier 24 which amplifies secondarily the inputted signal to the auxiliary amplifier 25 is arranged at the front stage (drive stage) of the auxiliary amplifier 25. The auxiliary amplifier drive amplifier 24 is formed of a first transistor and a first matching circuit arranged at one of the input side and output side of the first transistor. Like the second transistor, in the feed-forward amplifying device 1 according to the present embodiment, a depletion-mode GaAs FET which provides a small output power alone and has a different bias voltage and a shorter delay time, compared with the first transistor forming the main amplifier 15, may be used as the fourth transistor.

The DC/DC converter (second voltage converter) (to be described later) 31-2 supplies electric power to the auxiliary amplifier 25 and the auxiliary amplifier drive amplifier 24.

Here, the auxiliary amplifier 25 and the auxiliary amplifier drive amplifier 24 will be explained below by referring to FIG. 10.

Figure 10:
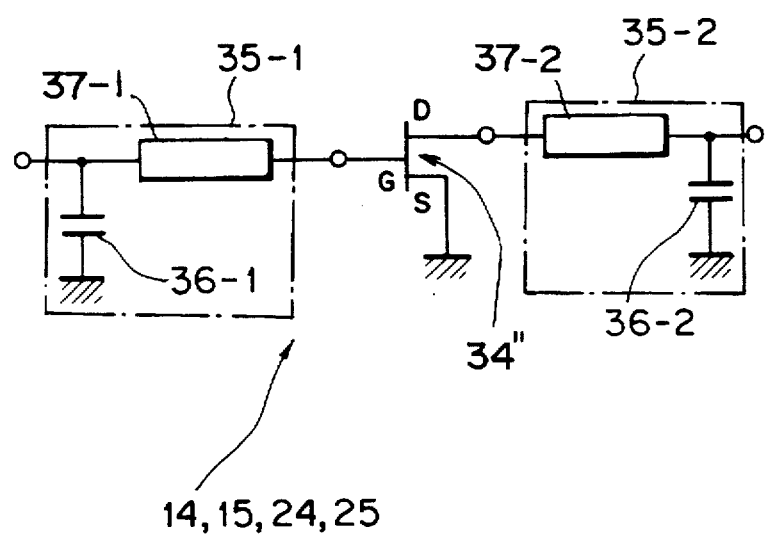
FIG. 10 is a block diagram illustrating the configuration of an amplifier with a GaAs FET.

FIG. 10 is a circuit structural diagram illustrating the auxiliary amplifier 25 and the auxiliary amplifier drive amplifier 24 each using the GaAs FET 34" acting as the second or fourth transistor. In the auxiliary amplifier 25 or the auxiliary amplifier drive amplifier 24 shown in FIG. 10, the GaAs FET is used in a source-grounded configuration. The matching circuit 35-1 is connected to the input side of the GaAs FET 34" and the matching circuit 35-2 is connected to the output side of the GaAs FET 34" to attenuate undesired harmonics. The low-pass circuit with a capacitor connected in parallel is used for the matching circuits 35-1 and 35-2 in order to simplify the gain adjustment. Numeral 36-1 and 36-2 represent capacitors and numerals 37-1 and 37-2 represent lines.

Figure 11:
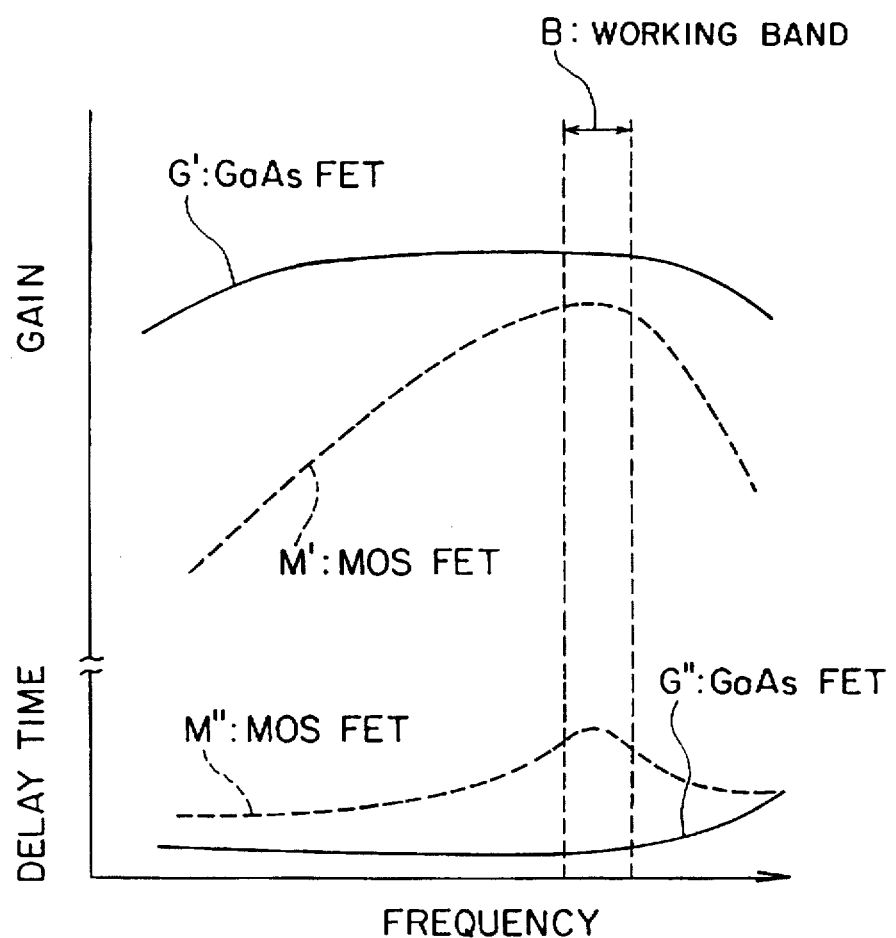
FIG. 11 is a diagram used for explaining the operation of the feed-forward amplifying device according to the first embodiment of the present invention.

FIG. 11 shows the frequency to gain relationship of a MOSFET and GaAs FET and the frequency to delay time relationship of the MOSFET and GaAs FET. In FIG. 11, letters M' and M" stand for a MOSFET and letters G and G" stand for a GaAs FET, respectively.

As shown in FIG. 11, the MOSFET has a smaller gain than the GaAs FET. The gain of the GaAs FET is nearly constant, without depending on frequencies. The gain of the MOSFET increases gradually to the maximum value as the frequency increases and then decreases with the further increasing frequencies.

Furthermore, as shown in FIG. 11, the delay time of the MOSFET is larger than that of the GaAs FET. The delay time of the GaAs FET is nearly constant without depending on frequencies. The delay time of the GaAs FET increases when the frequency exceeds a certain value. However, the delay time of the MOSFET increases gradually to the maximum value as frequency increases and then decreases as the frequency further increases.

For that reason, when each of the main amplifier 15 and the main amplifier drive amplifier 14 is formed using a MOSFET which can produce a large signal output, it is needed to match the frequency band of an input signal to the working band B being a narrow band to increase the gain. Since that matching operation increases the delay time of the MOSFET in the working band B, the delay time of each of the main amplifier 15 and the main amplifier drive amplifier 14 becomes large (this is applicable to the bipolar transistor).

The delay time $\tau$ is expressed in $\tau=-\partial\psi/\partial\omega$, where $\psi$ is a phase and $\omega(=2\pi f)$ is an angular frequency. When each of the auxiliary amplifier 25 and the auxiliary amplifier drive amplifier 24 is formed using a GaAs FET, frequencies at which a change in phase is small can be used as the working band because the gain is independent of the value of a frequency. The working band may be the working band B shown in FIG. 11. Hence, the delay time of the GaAs FET is small in the working band B so that the delay time of each of the auxiliary amplifier 25 and the auxiliary amplifier drive amplifier 24 is small.

As described above, compared with the circuit configuration built using bipolar transistors or MOSFET, the auxiliary amplifier 25 and the auxiliary amplifier drive amplifier 24 each built with a GaAs FET can shorten the delay time by about 3 nanoseconds so that the delay line 27 (to be described later) can be shortened to reduce the output loss of the delay line 27. As a result, the feed-forward amplifying device 1 according to the present embodiment can reduce its power consumption.

Numeral 20 represents a distortion removing loop circuit unit. The distortion removing circuit unit 20 outputs only the main signal component from the signal in the main signal system at the rear stage of the main amplifier 15, using the distortion extracted signal amplified by the auxiliary amplifier 25.

That is, the distortion removing loop circuit unit unit 20 is arranged at the rear stage of the main amplifier 15. The distortion removing loop circuit unit unit 20 outputs the main signal from the signal of the main signal system at the rear stage of the main amplifier 15 using the distortion extracted signal obtained by canceling the main signal component among the signals from the main amplifier 15. The distortion removing loop circuit unit unit 20 includes the phase shifter 22, the attenuator 23, the distortion component removing unit 26 and the delay line (second delay unit) 27, in addition to the auxiliary amplifier 25 and the auxiliary amplifier drive amplifier 24. Numeral 32 represents a terminator for matching an impedance.

The phase shifter 22 varies the phase of the distortion extracted signal from the distortion extracted signal outputting unit 16 according to the control information from the control circuit 33. The attenuator 23 varies the amplitude of the distortion extracted signal from the distortion extracted signal outputting unit 16 according to control information from a control circuit 33.

The delay line 27 delays the signal amplified by the main amplifier 15. The delay line 27 receives the main signal from the main amplifier 15, together with distortion extracted signal components generated in the main amplifier 15, and then delays them by a predetermined time decided by considering the time which is taken to pass through the phase shifter 22, the attenuator 23, the auxiliary amplifier drive amplifier 24 and the auxiliary amplifier 25.

In this case, since GaAs FETs are used to build the auxiliary amplifier drive amplifier 24 and the auxiliary amplifier 25, the delay time can be reduced so that the delay line 27 can be shortened, compared with the general delay line.

Moreover, the distortion component removing unit 26 synthesizes the amplified signal from the auxiliary amplifier 25 with the signal from the delay line 27 and then outputs the main signal of which the distortion signal component is removed. The distortion component removing unit 26 cancels the components (distortion extracting signal components generated in the main amplifier 15) other than the main signal component.

As shown in FIG. 1, the DC/DC converter 31-1 acting as a first voltage converter which converts the voltage from the power supply unit (primary power source) 30 into a voltage suitable for the main amplifier 15 and the main amplifier drive amplifier 14 is used as a bias power supply unit for the main amplifier 15 and the main amplifier drive amplifier 14. Moreover, the DC/DC converter 31-2 acting as a second voltage converter which converts the voltage from the power supply unit (primary power source) 30 into a voltage suitable for the auxiliary amplifier 25 and the auxiliary amplifier drive amplifier 24 is used as a bias power supply unit for the auxiliary amplifier 25 and the auxiliary amplifier drive amplifier 24.

That is, the bias voltage for the main amplifier 15 and the main amplifier drive amplifier 14 each formed of a bipolar transistor or MOSFET is 24 to 28 volts. The bias voltage for the auxiliary amplifier 25 and the main amplifier drive amplifier 24 each formed of GaAs FETs is 8 to 10 volts. Therefore, since the power supply unit 30 supplies one kind of power source voltage, the DC/DC converter 31-1 converts the voltage into 24 to 28 volts to supply to the main amplifier 15 and the main amplifier drive amplifier 14 and the DC/DC converter 31-2 converts the voltage into 8 to 10 volts to supply to the auxiliary amplifier 25 and the auxiliary amplifier drive amplifier 24.

In the feed-forward amplifying device 1 having the above-mentioned configuration according to the first embodiment of the present invention, when a multicarrier signal is input as a main signal, the distortion extracting loop circuit unit unit 10 outputs a distortion extracted signal so as to minimize the canceled main signal component while the distortion removing loop circuit unit 20 outputs the main signal to minimize the canceled distortion signal component.

As described above, according to the feed-forward amplifying device 1 according to the first embodiment of the present invention, it is not needed to form the main amplifier 15 in the form of a multi-staged transistor by forming the main amplifier 15 and the main amplifier drive amplifier 14 with a bipolar transistor or MOSFET. Hence, there is the advantage in that even a small device can realize a high-power output operation.

In the feed-forward amplifying device 1 according to the present embodiment, since each of the auxiliary amplifier 25 and the auxiliary amplifier drive amplifier 24 is built with GaAs FETs, the delay time, for example, in 800 MHz band can be set to about 5 nanoseconds.

With the auxiliary amplifier 25 and the auxiliary amplifier drive amplifier 24 conventionally formed with a bipolar transistor or MOSFET, the delay time is about 8 nanoseconds. Hence, that configuration has a longer delay time than the configuration of the auxiliary amplifier 25 and the auxiliary amplifier drive amplifier 24 each formed with GaAs FETs.

As described above, the delay line 27 can be shortened by about 60 cm by shortening the delay time by about 3 nanoseconds, compared with the conventional configuration.

As a result, the output loss of the delay line 27 can be decreased by about 0.2 dB.

As described above, in the feed-forward amplifying device 1 according to the present embodiment, the main amplifier 15 and the main amplifier drive amplifier 14 each formed using bipolar transistors or MOSFETs can lead advantageously to slimming the whole device and outputting high power. The auxiliary amplifier 25 and the auxiliary amplifier drive amplifier 24 each formed using a GaAs FET can lead advantageously to slimming the whole device and reducing the power consumption.

Figure 3:
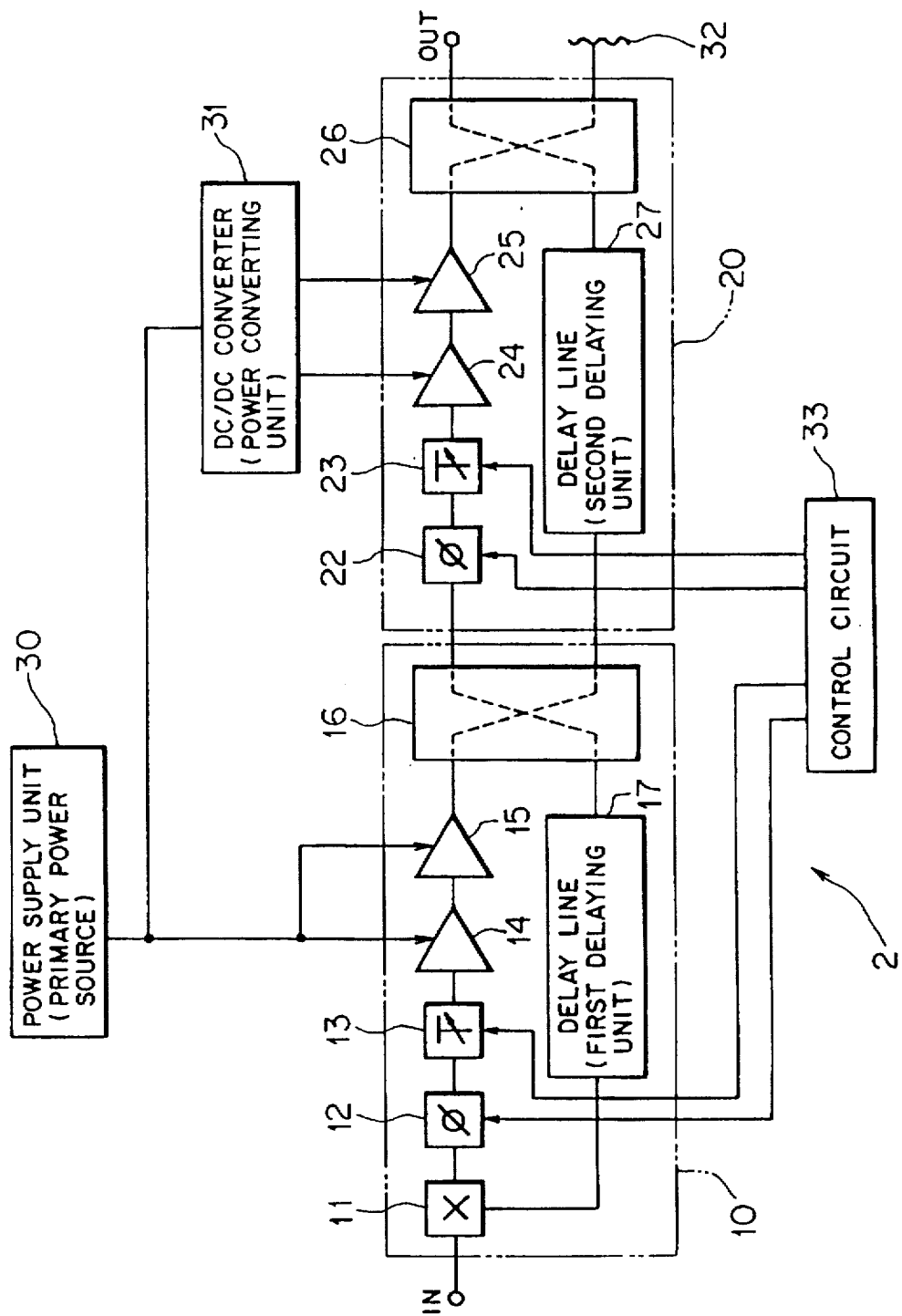
FIG. 3 is a block diagram showing the configuration of a feed-forward amplifying device according to the second embodiment of the present invention.

(b) Second Embodiment:

FIG. 3 is a block diagram illustrating a feed-forward amplifying device according to the second embodiment of the present invention. Like the first embodiment, the feed-forward amplifying device 2 shown in FIG. 3 amplifies the multicarrier signal from the main signal system.

The feed-forward amplifying device 2 shown in FIG. 3 has basically the configuration similar to that in the first embodiment. However, the difference is that the power supply unit 30 acting as a primary power supply unit which supplies a voltage suitable for the main amplifier 15 and the main amplifier drive amplifier 14 is used as a bias power supply unit for the main amplifier 15 and the main amplifier drive amplifier 14 and the DC/DC converter 31 acting as a voltage converter which converts the voltage from the power supply unit 30 into a voltage suitable for the auxiliary amplifier 25 and the auxiliary amplifier drive amplifier 24 is used as a bias power supply unit for the auxiliary amplifier 25 and the auxiliary amplifier drive amplifier 24.

That is, the bias voltage for the main amplifier 15 and the main amplifier drive amplifier 14 each formed of bipolar transistors or MOSFETs is 24 to 28 volts. The bias voltage for the auxiliary amplifier 25 and the auxiliary amplifier drive amplifier 24 each formed of a GaAs FET is 8 to 10 volts. Therefore the power supply unit unit 30 supplies directly a voltage of 24 to 28 volts to the main amplifier 15 and the main amplifier drive amplifier 14. The DC/DC converter 31 converts the voltage of the power supply unit unit 30 into a voltage of 8 to 10 volts to supply it to the auxiliary amplifier 25 and the auxiliary amplifier drive amplifier 24.

As shown in FIG. 8, each of the main amplifier 15 and the main amplifier drive amplifier 14 consists of the MOSFET 34, and the matching circuits 35-1 and 35-2. As shown in FIG. 9, each of the main amplifier 15 and the main amplifier drive amplifier 14 consists of the bipolar transistor 34, and the matching circuits 35-1 and 35-2.

As shown in FIG. 10, each of the auxiliary amplifier 25 and the auxiliary amplifier drive amplifier 24 consists of the GaAs FET 34", the matching circuits 35-1 and 35-2, and capacitors 36-1 and 36-2.

Like the first embodiment, in the feed-forward amplifying device 2 having the configuration according to the second embodiment of the present invention, when a multicarrier signal acting as a main signal is input, the distortion extracting loop circuit unit 10 outputs a distortion extracting signal so as to minimize the canceled main signal component and the distortion extracting loop circuit unit 20 outputs the main signal so as to minimize the canceled distortion signal component.

As described above, the feed-forward amplifying device 2 according to the second embodiment of the present invention has the same advantage as that of the first embodiment. The two voltage converters in the first embodiment can be reduced to one unit by supplying directly the voltage of the power supply unit unit 30 to the main amplifier 15 and the main amplifier drive amplifier 14. Hence, the power consumption corresponding to the conversion loss of the voltage converter can be reduced so that the power consumption of the feed-forward amplifying device 2 can be reduced.

Figure 4:
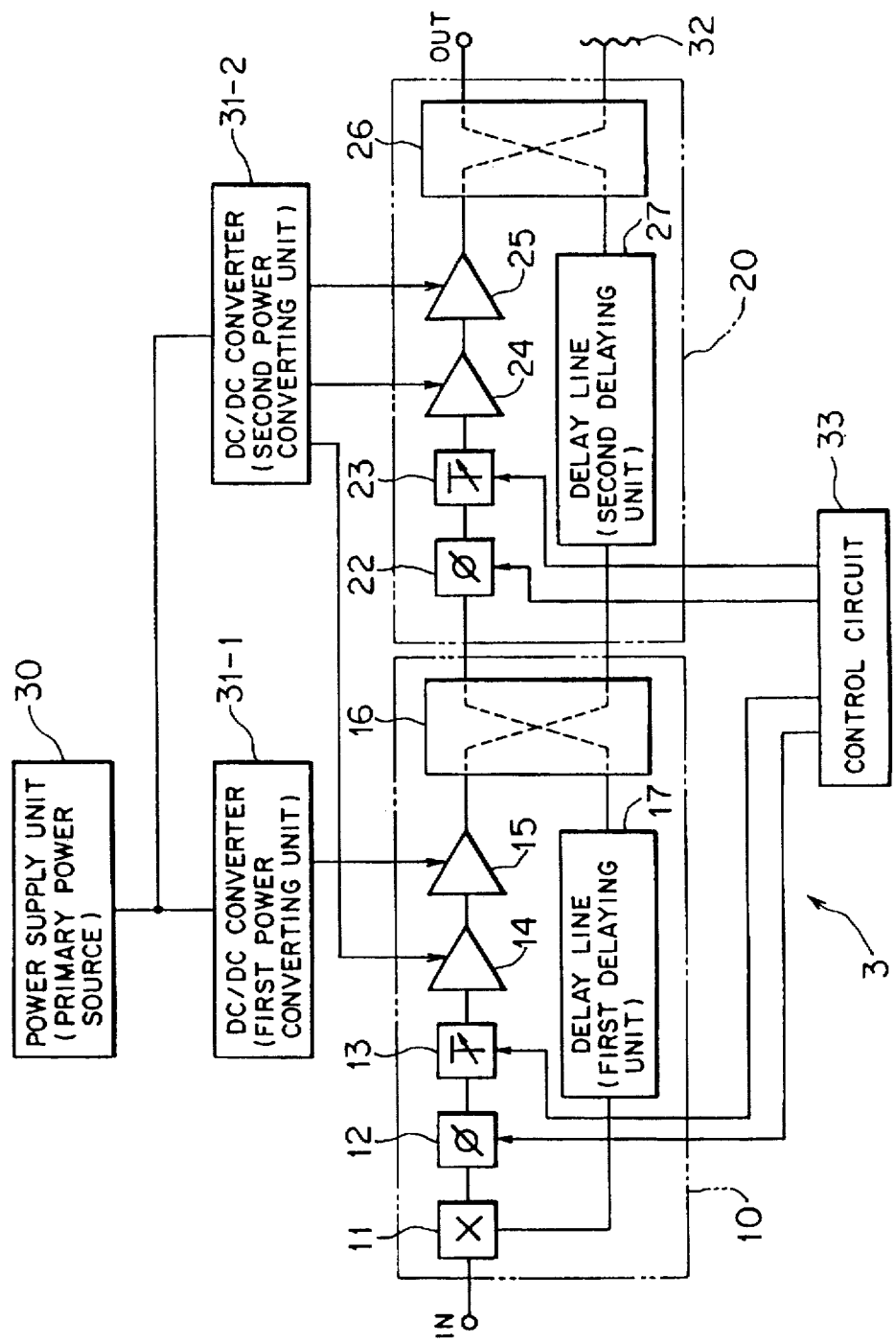
FIG. 4 is a block diagram showing the configuration of a feed-forward amplifying device according to the third embodiment of the present invention.

(c) Third Embodiment:

FIG. 4 is a block diagram illustrating a feed-forward amplifying device according to the third embodiment of the present invention. Like the first embodiment, the feed-forward amplifying device 3 shown in FIG. 4 amplifies a multicarrier signal from the main signal system.

The feed-forward amplifying device 3 shown in FIG. 4 is basically similar to the first embodiment. However, the difference is that the main amplifier 14 is formed of a GaAs FET; that the DC/DC converter 31-1 acting as a primary voltage converting unit which converts the voltage from the power supply unit 30 acting as a first power source into a voltage suitable for the main amplifier 15 is used as the bias power supply unit for the main amplifier 15; and that the DC/DC converter 31-2 acting as a second voltage converter which converts the voltage from the power supply unit 30 into a voltage suitable for the auxiliary amplifier 25, the main amplifier drive amplifier 14 and the auxiliary amplifier drive amplifier 24 is used as a bias power source for the auxiliary amplifier 25, the main amplifier drive amplifier 14 and the auxiliary amplifier drive amplifier 24.

That is, the bias voltage for the main amplifier 15 formed of a bipolar transistor or a MOSFET is 24 to 28 volts. The bias voltage for the auxiliary amplifier 25, the main amplifier drive amplifier 14, and the auxiliary amplifier drive amplifier 24 each formed of GaAs FETs is 8 to 10 volts. Hence, the DC/DC converter 31-1 converts the voltage from the power supply unit unit 30 outputting one kind of power supply unit voltage to supply it to the main amplifier 15 while the DC/DC converter 31-2 converts the voltage into 8 to 10 volts to supply it to the auxiliary amplifier 25, the main amplifier drive amplifier 14, and the auxiliary amplifier drive amplifier 24.

As shown in FIG. 8, the main amplifier 15 consists of the MOSFET 34, and the matching circuits 35-1 and 35-2. As shown in FIG. 9, the main amplifier 15 consists of the bipolar transistor 34', and the matching circuits 35-1 and 35-2.

As shown in FIG. 10, each of the main amplifier drive amplifier 14, the auxiliary amplifier 25, and the auxiliary amplifier drive amplifier 24 consists of the GaAs FET 34", the matching circuits 35-1 and 35-2, and the capacitors 36-1 and 36-2.

Like the first embodiment, in the feed-forward amplifying device 3 having the above-mentioned configuration according to the third embodiment of the present invention, when a multicarrier signal acting as a main signal is inputted, the distortion extracting loop circuit unit 10 outputs the distortion extracting signal so as to minimize the canceled main signal component while the distortion removing loop circuit unit 20 outputs the main signal so as to minimize the canceled distortion signal component.

As described above, according to the feed-forward amplifying device 3 in the third embodiment of the present invention, it is not needed to form the main amplifier in a multi-staged transistor configuration by forming the main amplifier 15 with a bipolar transistor or MOSFET. As a result, it is possible to miniaturize the device and to realize the high-power output operation.

According to the feed-forward amplifying device 3 according to the third embodiment of the present invention, the delay lines 17 and 27 can be shortened by using the auxiliary amplifier 25, the main amplifier drive amplifier 14, and the auxiliary amplifier drive amplifier 24 each formed of a GaAs FET. This feature leads to the device miniaturization and lower power consumption.

Figure 5:
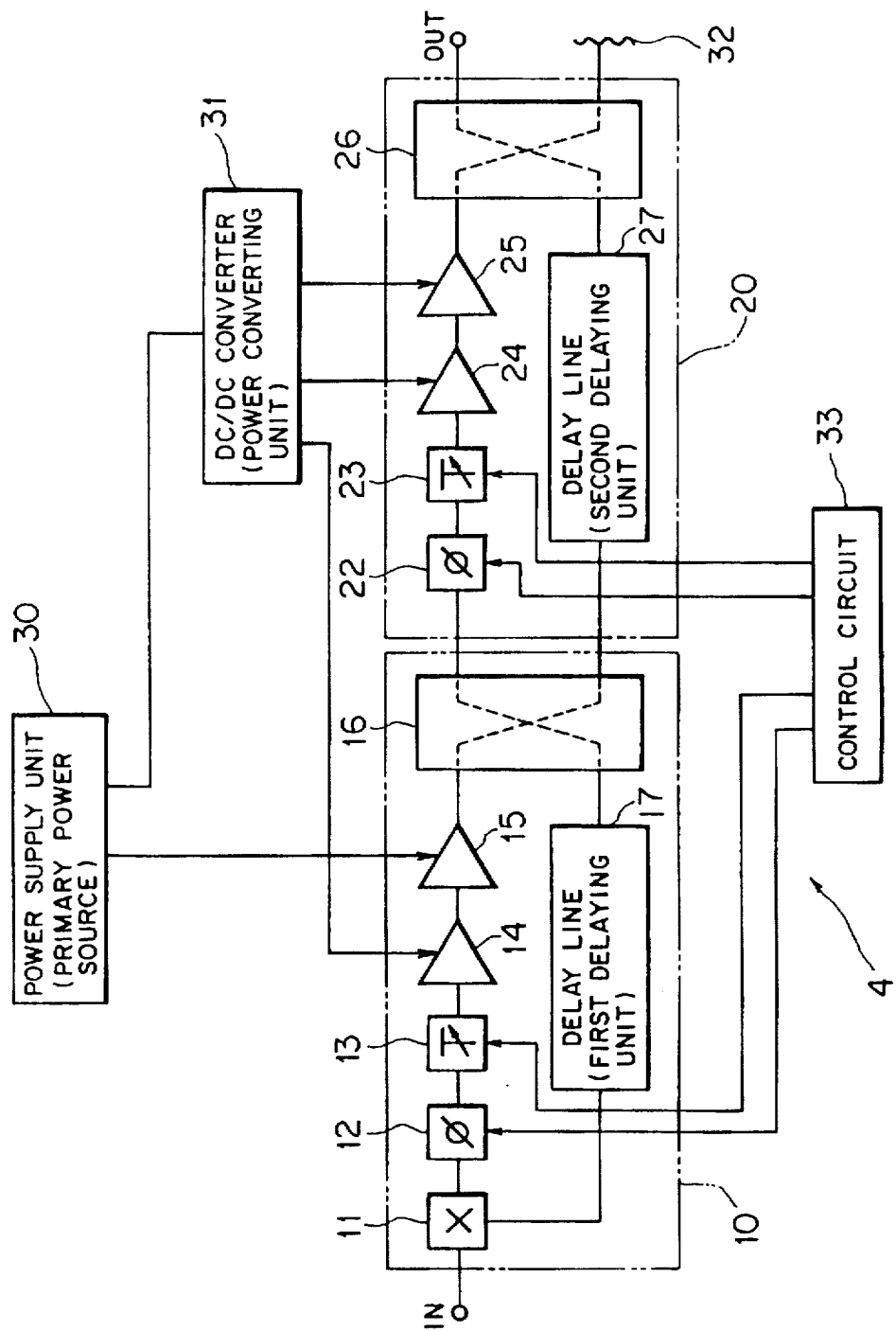
FIG. 5 is a block diagram showing the configuration of a feed-forward amplifying device according to the fourth embodiment of the present invention.

(d) Fourth Embodiment:

FIG. 5 is a block diagram showing a feed-forward amplifying device according to the fourth embodiment of the present invention. Like the first embodiment, the feed-forward amplifying device 4 shown in FIG. 5 amplifies the multicarrier signal from the main signal system.

The feed-forward amplifying device 4 shown in FIG. 5 is basically similar to the third embodiment. However, the difference is that the power supply unit 30 acting as a primary power source which supplies a voltage suitable for the main amplifier 15 is used as a bias power source for the main amplifier 15 and that the DC/DC converter 31 acting as a voltage converter which converts a voltage of the power supply unit 30 into a voltage suitable for the auxiliary amplifier 25, the main amplifier drive amplifier 14, and the auxiliary amplifier drive amplifier 24 is used as a bias power supply unit for the auxiliary amplifier 25, the main amplifier drive amplifier 14, and the auxiliary amplifier drive amplifier 24.

That is, the bias voltage for the main amplifier 15 formed of a bipolar transistor or a MOSFET is 24 to 28 volts. The bias voltage supplied for the auxiliary amplifier 25, the main amplifier drive amplifier 14, and the auxiliary amplifier drive amplifier 24 each formed of a GaAs FET is 8 to 10 volts. Hence, the voltage of the power supply unit unit 30, of 24 to 28 volts, is directly supplied to the main amplifier 15. The DC/DC converter 31 converts the voltage from the power supply unit unit 30 into 8 to 10 volts and then supplies the converted voltage to the main amplifier drive amplifier 14 and the auxiliary amplifier drive amplifier 24.

The main amplifier 15 consists of either the bipolar transistor 34', and the matching circuits 35-1 and 35-2, as shown in FIG. 9, or the MOSFET 34, and the matching circuits 35-1 and 35-2, as shown in FIG. 8.

Each of the main amplifier drive amplifier 14, the auxiliary amplifier 25, and the auxiliary amplifier drive amplifier 24, as shown in FIG. 10, includes the GaAs FET 34", the matching circuits 35-1 and 35-2, and the capacitors 36-1 and 36-2.

In the feed-forward amplifying device 4 having the above-mentioned configuration according to the fourth embodiment of the present invention, when a multicarrier signal acting as a main signal is inputted, the distortion extracting loop circuit unit 10 outputs a distortion extracting signal to minimize the canceled main signal component while the distortion extracting circuit unit 20 outputs the main signal so as to minimize the canceled distortion signal component.

As described above, the feed-forward amplifying device 4 according to the fourth embodiment of the present invention has the same advantage as that in the third embodiment described above. In addition, the two voltage converters in the third embodiment can be reduced to one unit by supplying directly the voltage of the power supply unit unit 30 to the main amplifier 15. As a result, the power consumption corresponding to the conversion loss of the voltage converter can be reduced. Hence, the feed-forward amplifying device 4 has the advantage of reducing its power consumption.

Figure 6:
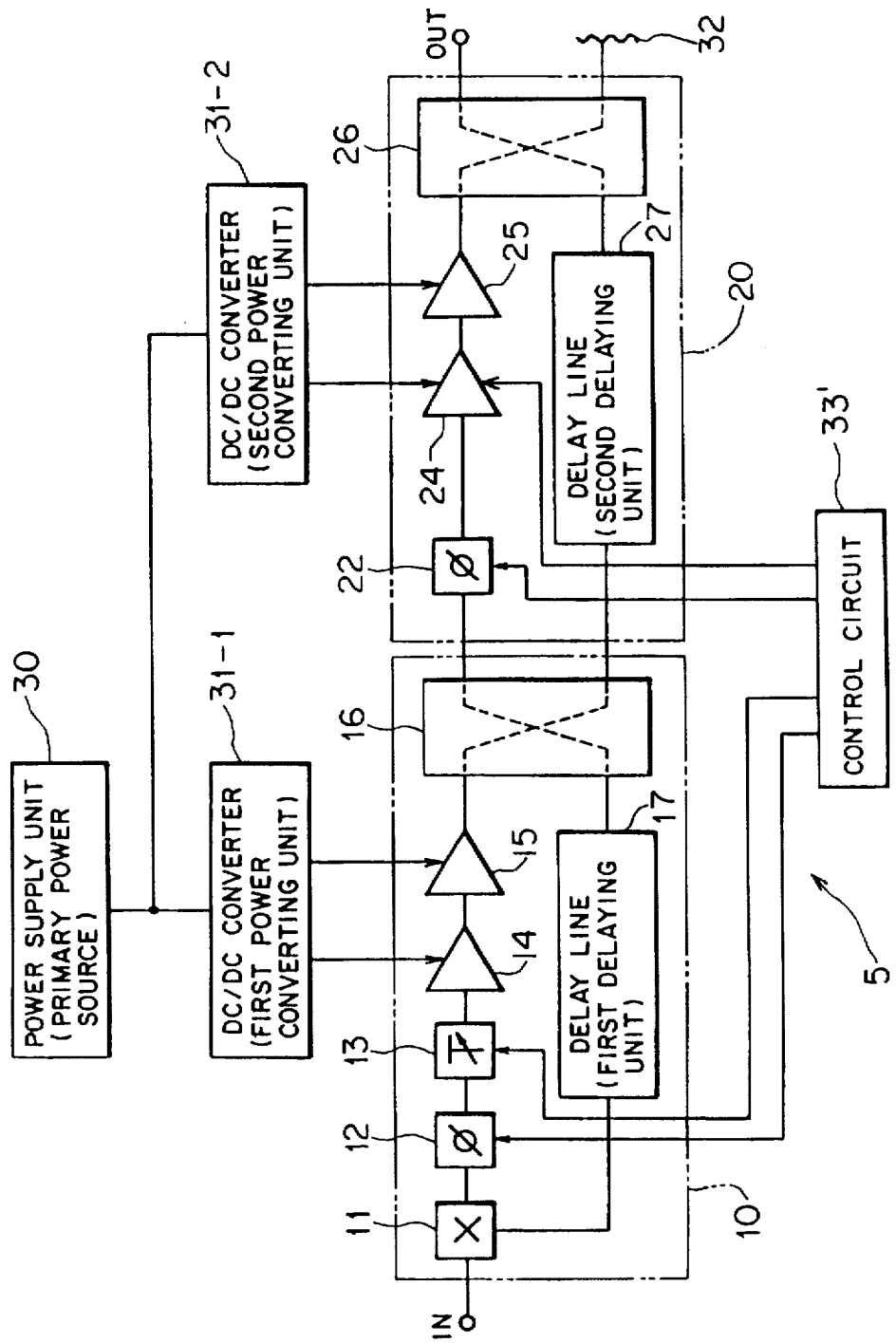
FIG. 6 is a block diagram showing the configuration of a feed-forward amplifying device according to the fifth embodiment of the present invention.

(e) Fifth Embodiment:

FIG. 6 is a block diagram showing a feed-forward amplifying device according to the fifth embodiment of the present invention. Like the first embodiment, the feed-forward amplifying device 5 shown in FIG. 6 amplifies the multicarrier signal from the main signal system.

The feed-forward amplifying device 5 shown in FIG. 6 is basically similar to the first embodiment. However, the difference is that the auxiliary amplifier drive amplifier 24 is formed as a variable gain type amplifier that controls the gain according to the gate voltage control signal from the control circuit 33'. Thus, the gain to a temperature change of the auxiliary amplifier 25 is corrected. Moreover, the difference is that the delay time decided by considering the passage time in the attenuator 23 is reduced by omitting the attenuator shown in FIG. 1.

That is, in the feed-forward amplifying device 5 shown in FIG. 6, each of the main amplifier 15 and the main amplifier drive amplifier 14 is formed of a bipolar transistor or MOSFET.

Each of the auxiliary amplifier 25 and the auxiliary amplifier drive amplifier 24 is formed of a GaAs FET. The gain correction amount of each of the auxiliary amplifier 25 and auxiliary amplifier drive amplifier 24 becomes small by using a GaAs FET which has a gain to temperature characteristic smaller than that of the bipolar transistor or MOSFET to the auxiliary amplifier 25 and the auxiliary amplifier drive amplifier 24. As a result, the gain of the auxiliary amplifier drive amplifier 24 can be controlled according to the gate voltage control signal from the control circuit 33'.

As shown in FIG. 8, each of the main amplifier 15 and the main amplifier drive amplifier 14 consists of the MOSFET 34, and the matching circuits 35-1 and 35-2. As shown in FIG. 9, each of the main amplifier 15 and the main amplifier drive amplifier 14 consists of the bipolar transistor 34', and the matching circuits 35-1 and 35-2.

Each of the auxiliary amplifier 25 and the auxiliary amplifier drive amplifier 24, as shown in FIG. 10, consists of the GaAs FET 34", the matching circuits 35-1 and 35-2 and the capacitors 36-1 and 36-2.

Like the first embodiment, in the feed-forward amplifying device 5 having the above-mentioned configuration according to the fifth embodiment of the present invention, when a multicarrier signal is inputted as a main signal, the distortion extracting circuit unit 10 outputs a distortion extracted signal so as to minimize the canceled main signal component while the distortion removing loop circuit unit 20 outputs the main signal so as to minimize the canceled distortion signal component.

Figure 13:
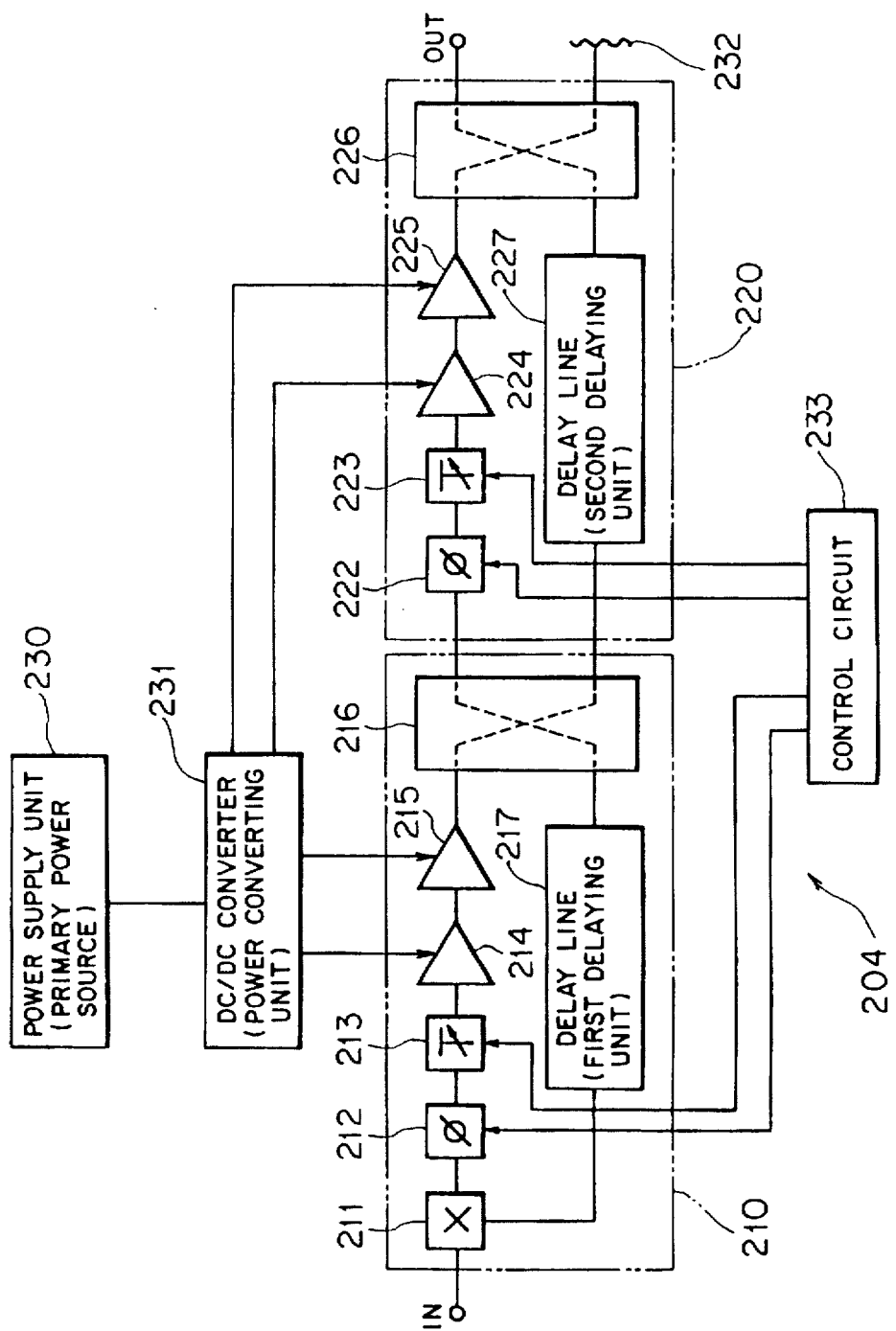
FIG. 13 is a block diagram illustrating the configuration of a general feed-forward amplifying device.

As described above, the feed-forward amplifying device 5 according to the fifth embodiment of the present invention has the same advantage as that of the first embodiment. Moreover, the gain of the auxiliary amplifier 25 can be amended to its temperature change by forming the auxiliary amplifier drive amplifier 24 as a variable gain type amplifier. The delay line 27 can be shortened by omitting the attenuator 223 used in the conventional feed-forward amplifying device shown in FIG. 13 to reduce the delay time decided by considering the passage time in the attenuator 223.

The gain correction amount becomes small by forming each of the auxiliary amplifier 25 and the auxiliary amplifier drive amplifier 24 with a GaAs FET. Thus the gain of the auxiliary amplifier drive amplifier 24 can be advantageously controlled according to the gate voltage control signal from the control circuit 33'.

Since the gain variable unit using a diode has a delay time of about 0.8 nanoseconds in 800 MHz band, the delay time can be reduced by controlling the gain of the auxiliary amplifier drive amplifier 24 according to the gate voltage control voltage from the control circuit 33'. As a result, the size and the transmission loss of the delay line 27 can be realized to a smaller value, respectively.

In the feed-forward amplifying devices 2 to 4 according to the second to fourth embodiments, the attenuator 23 may be omitted by forming the auxiliary amplifier drive amplifier 24 as a variable gain type amplifier.

Figure 7:
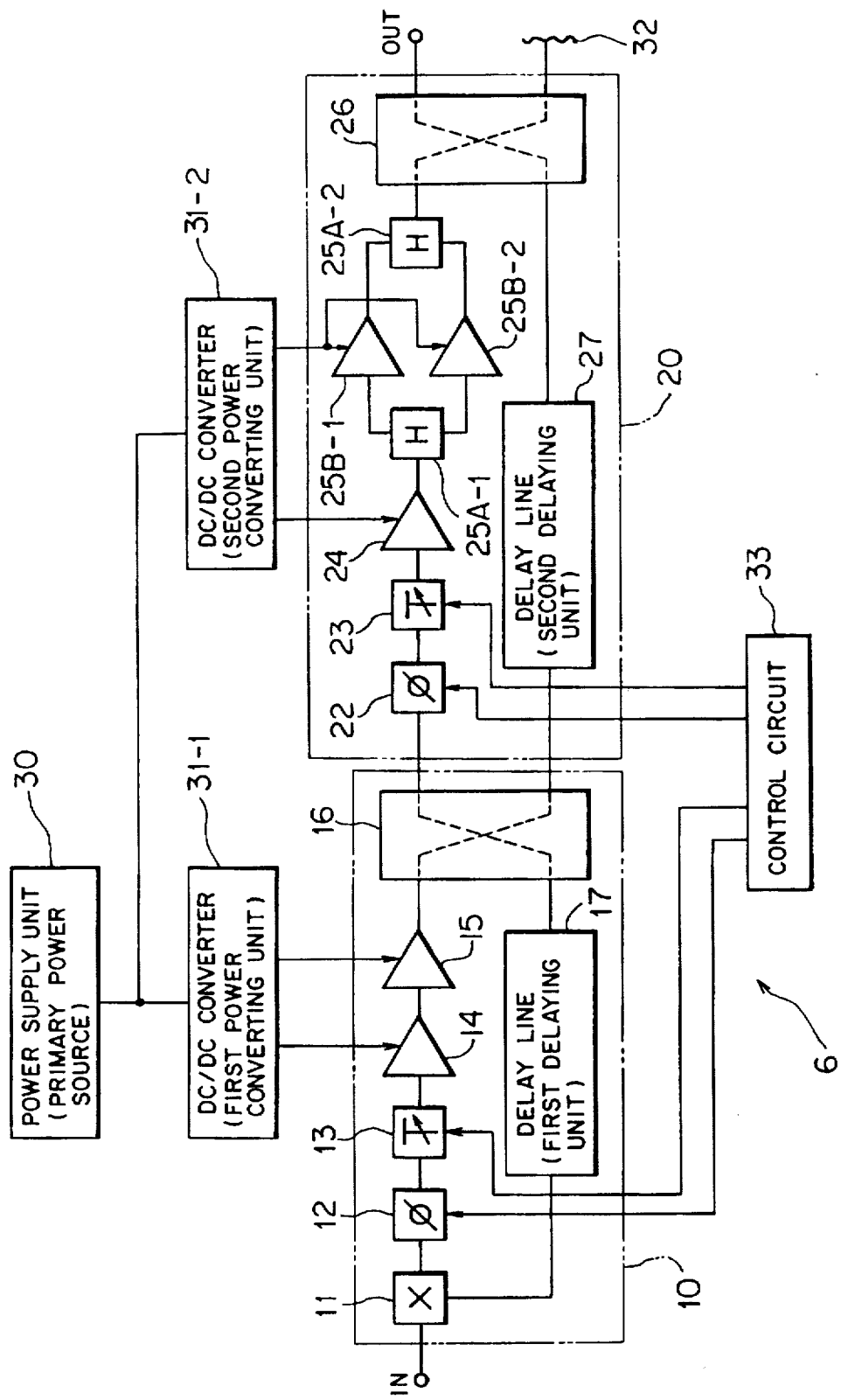
FIG. 7 is a block diagram showing the configuration of a feed-forward amplifying device according to the sixth embodiment of the present invention.

(f) Sixth Embodiment:

FIG. 7 is a block diagram illustrating a feed-forward amplifying device according to the sixth embodiment of the present invention. Like the first embodiment, the feed-forward amplifying device 6 shown in FIG. 7 amplifies the multicarrier signal in the main signal system.

The feed-forward amplifying device 6 shown in FIG. 7 is basically similar to the first embodiment in configuration described above. However, the difference is that each of the auxiliary amplifiers 25B-1 and 25B-2 is formed as a balanced-type amplifier using hybrid circuits 25A-1 and 25A-2.

That is, in the feed-forward amplifying device 6 shown in FIG. 7, each of the main amplifier 15 and the main amplifier drive amplifier 14 is formed of a bipolar transistor or MOSFET, and each of the auxiliary amplifiers 25B-1 and 25B-2 and the auxiliary amplifier drive amplifier 24 is formed of a GaAs FET. With the GaAs FET and the auxiliary amplifier each having a small output return loss, ripples generally occur when the distortion component removing unit 26 synthesizes the signal from the auxiliary amplifier with the signal from the delay line 27. Hence, it is necessary to set the return loss of the auxiliary amplifier to a large value.

For that reason, in the feed-forward amplifying device 6 according to the present embodiment, each of the auxiliary amplifiers 25B-1 and 25B-2 is formed as a balanced-type amplifier using the hybrid circuits 25A-1 and 25A-2 to enlarge the return loss.

As shown in FIG. 8, each of the main amplifier 15 and the main amplifier drive amplifier 14 consists of the MOSFET 34, and the matching circuits 35-1 and 35-2. As shown in FIG. 9, each of the main amplifier 15 and the main amplifier drive amplifier 14 consists of the bipolar transistor 34', and the matching circuits 35-1 and 35-2.

Each of the auxiliary amplifier 25B-1 and 25B-2 and the auxiliary amplifier drive amplifier 24, as shown in FIG. 10, consists of the GaAs FET 34", the matching circuits 35-1 and 35-2 and the capacitors 36-1 and 36-2.

Like the first embodiment, in the feed-forward amplifying device 6 having the above-mentioned configuration according to the sixth embodiment, when a multicarrier signal is inputted as a main signal, the distortion extracting loop circuit unit unit 10 outputs the distortion extracting signal so as to minimize the canceled main signal component while the distortion removing loop circuit unit 20 outputs the main signal so as to minimize the canceled distortion signal component.

As described above, the sixth embodiment of the present invention has the same advantage as the first embodiment. Moreover, ripples produced at the time the distortion component removing unit 26 synthesizes the signals from the auxiliary amplifiers with the signal from the delay line 27 can be suppressed by increasing the return loss of each of the auxiliary amplifiers 25B-1 and 25B-2.

When the return loss is increased at 800 MHz band using an isolator, the delay time increases by about 1.5 nanoseconds. However, in the feed-forward amplifying device 6 according to the present embodiment, the increase in delay time is maintained to about 0.8 nanoseconds. Hence, it is possible to decrease the physical size and loss of the delay line 27 so that the power consumption of the main amplifier 15 can be further reduced.

Figure 14:
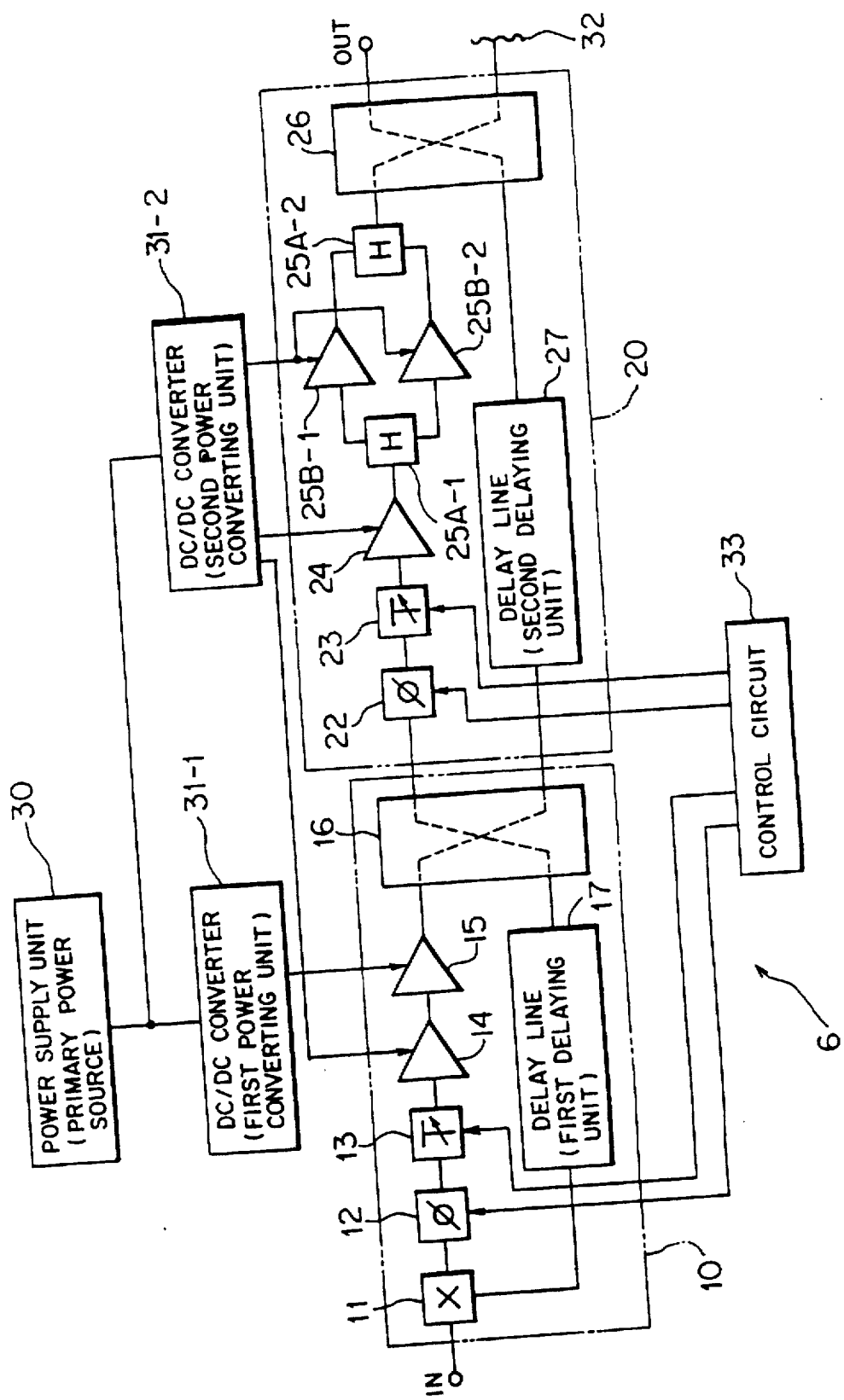
FIG. 14 is a block diagram illustrating the sixth embodiment of the present invention.
Figure 15:
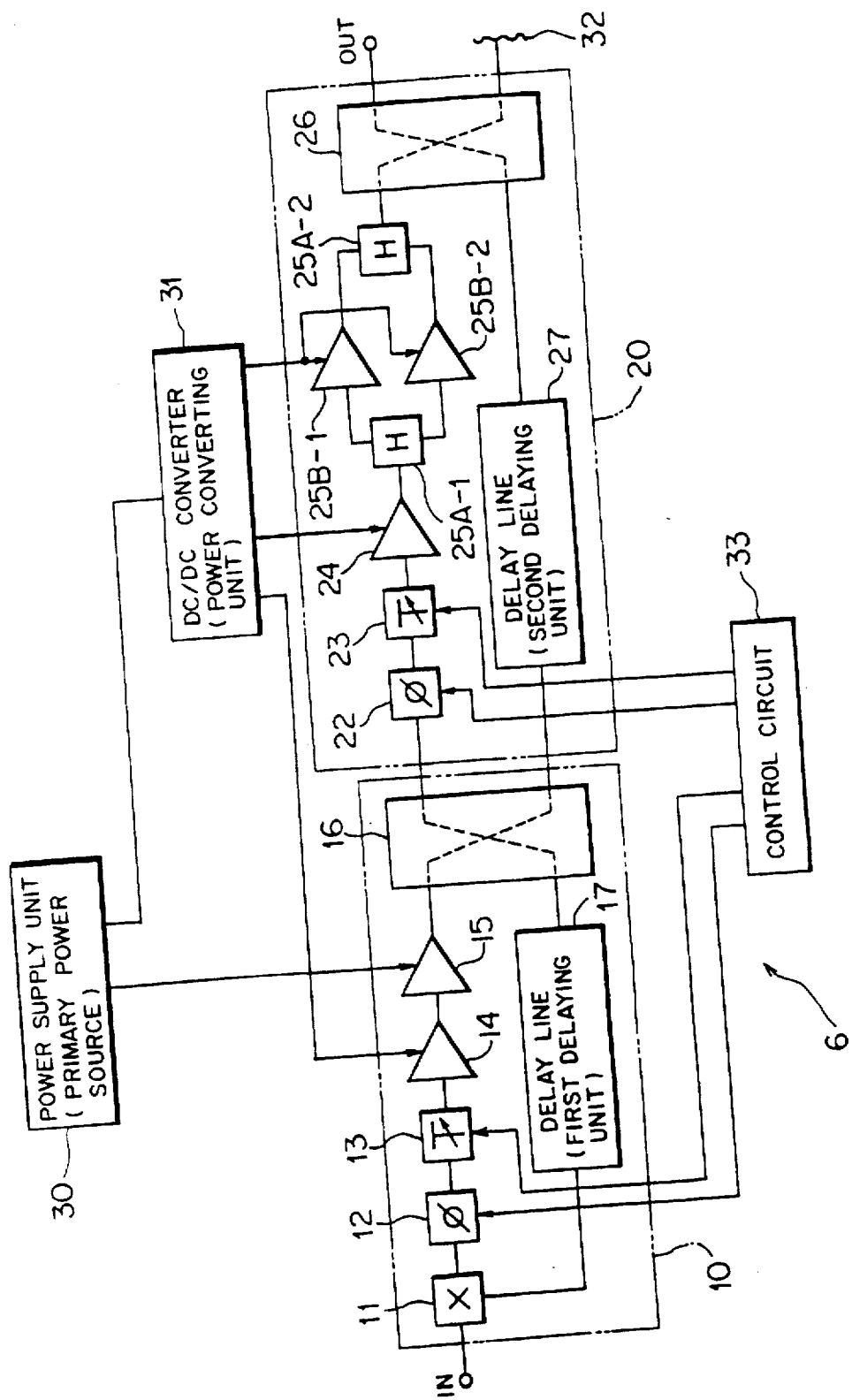
FIG. 15 is a block diagram illustrating the sixth embodiment of the present invention.

In the feed-forward amplifying devices 1 to 5 according to the first to fifth embodiment, the auxiliary amplifier 25 may be formed as a balanced-type amplifier including the auxiliary amplifiers 25B-1 and 25B-2 and the hybrid circuits 25A-1 and 25A-2. FIGS. 14 and 15 illustrate such a structure.

In the feed-forward amplifying device 6 according to the present embodiment, the auxiliary amplifier drive amplifier 24 is formed as a variable gain type amplifier, whereby the attenuator 23 can be omitted.

(g) Others:

In the main amplifier drive amplifier 14, the main amplifier 15, the auxiliary amplifier drive amplifier 24, and the auxiliary amplifiers 25, 25B-1 and 25B-2 which are used in the feed-forward amplifying devices 1 to 6 according to the first to sixth embodiments of the present invention, the matching circuits 35-1 and 35-2 are arranged at the input side and output side of the transistor. However, the matching circuits 35-1 or 35-2 can be omitted.

The feed-forward amplifying devices 1 to 6 according to the first to sixth embodiments are applied to the amplifying device at a base station accommodating plural mobile units in a radio communication system such as digital automobile telephone systems.

That is, according to the present invention, the base station accommodating plural mobile stations includes a feed-forward amplifying device arranged in a transmitting unit which amplifies and transmits in common a signal including plural frequency components selected a every mobile station, in a frequency band used for transmitting signals to the mobile stations. The feed-forward amplifying device includes a main amplifier which amplifies a main signal in a main signal system, the main amplifier including a transistor with a long delay time providing a high power output, the distortion extracting loop circuit unit unit generating a distortion extracted signal obtained by canceling the main signal component of an output from the main amplifier; and a distortion removing loop circuit unit including an auxiliary amplifier which amplifies the distortion extracted signal from the distortion extracting loop circuit unit, the auxiliary amplifier including a transistor which provides an output alone smaller than that of a transistor forming said main amplifier and operates with a different bias voltage and has a short delay time, the distortion removing loop circuit unit outputting only the main signal component from a signal in the main signal system at the rear stage of the main amplifier using the distortion extracted signal amplified by the auxiliary amplifier.

As described above, in the base station including the feed-forward amplifying device according to the present invention, there is the advantage in that the signal delay time can be improved with small power consumption when the transmitting signal to mobile units accommodated in a base station is amplified in common as a multicarrier signal. Moreover, the small, high-power feed-forward amplifying device can be realized to amplify the transmitting signal with low distortion.

What is claimed is:

1. A feed-forward amplifying device comprising:
a distortion extracting loop circuit unit including a main amplifier which amplifies a main signal in a main signal system, said main amplifier including a first transistor and a first matching circuit disposed at to at least one of the input side and the output side of said first transistor, said distortion extracting loop circuit unit generating a distortion extracted signal obtained by canceling a main signal component of an output signal from said main amplifier; and
a distortion removing loop circuit unit including an auxiliary amplifier which provides a passage delay time shorter than that of said main amplifier and amplifies said distortion extracted signal from said distortion extracting loop circuit unit, said auxiliary amplifier including a second transistor with an output smaller than that of said first transistor alone and a second matching circuit arranged to at least one of the input side and the output side of said second transistor, said distortion removing loop circuit unit outputting only said main signal component from the signal in said main signal system at the rear stage of said main amplifier using said distortion extracted signal amplified by said auxiliary amplifier.

2. The feed-forward amplifying device according to claim 1, wherein said first transistor comprises a bipolar transistor or a MOSFET; and wherein said second transistor comprises a GaAs FET.

3. The feed-forward amplifying device according to claim 1, wherein said auxiliary amplifier comprises a balanced-type amplifier using a hybrid.

4. The feed-forward amplifying device according to claim 1, further comprising a first voltage converter for converting a voltage from a primary power source into a voltage suitable for said main amplifier to provide a bias power source for said main amplifier and a second voltage converter for converting a voltage from said primary power source into a voltage suitable for said auxiliary amplifier to provide a bias power source for said auxiliary amplifier.

5. The feed-forward amplifying device according to claim 1, wherein said first transistor comprises one of a bipolar transistor and a MOSFET and said second transistor comprises a GaAs FET the feed-forward amplifying device further comprising a first voltage converter for converting a voltage from a primary power source into a voltage suitable for said main amplifier to provide a bias power source for said main amplifier and a second voltage converter for converting a voltage from said primary power source into a voltage suitable for said auxiliary amplifier to provide a bias power source for said auxiliary amplifier.

6. The feed-forward amplifying device according to claim 1, wherein said auxiliary amplifier comprises a balanced-type amplifier using a hybrid, the feed-forward amplifying further comprising a first voltage converter for converting a voltage from a primary power source into a voltage suitable for said main amplifier to provide a bias power source for said main amplifier and a second voltage converter for converting a voltage from said primary power source into a voltage suitable for said auxiliary amplifier to provide a bias power source for said auxiliary amplifier.

7. The feed-forward amplifying device according to claim 1, further comprising a primary power source for supplying a voltage suitable for said main amplifier to provide a bias power supply unit for said main amplifier and a voltage converter for converting a voltage from said primary power source into a voltage suitable for said auxiliary amplifier to provide a bias power source for said auxiliary amplifier.

8. The feed-forward amplifying device according to claim 1, wherein said first transistor comprises one of a bipolar transistor and a MOSFET and said second transistor comprises a GaAs FET, the feed-forward amplifying device further comprising a primary power source for supplying a voltage suitable for said main amplifier to provide a bias power source for said main amplifier and a voltage converter for converting a voltage from said primary power source into a voltage suitable for said auxiliary amplifier to provide a bias power source for said auxiliary amplifier.

9. The feed-forward amplifying device according to claim 1, further comprising a primary power source for supplying a voltage suitable for said main amplifier to provide a bias power source for said main amplifier and a voltage converter for converting a voltage from said primary power source into a voltage suitable for said auxiliary amplifier to provide a bias power source for said auxiliary amplifier.

10. The feed-forward amplifying device according to claim 1, further comprising a main amplifier drive amplifier arranged in the front stage of said main amplifier, said main amplifier drive amplifier including a third transistor and a third matching circuit arranged to at least one of the input side and output side of said third transistor.

11. The feed-forward amplifying device according to claim 10, wherein said third transistor comprises a GaAs FET.

12. The feed-forward amplifying device according to claim 1, further comprising a main amplifier drive amplifier disposed in the front stage of said main amplifier, said main amplifier drive amplifier including a third transistor and a third matching circuit disposed at at least one of the input side and output side of said third transistor and an auxiliary amplifier drive amplifier disposed in the front stage of said auxiliary amplifier and formed of a fourth transistor of the same type as said third transistor and a fourth matching circuit disposed to at least one of the input side and output side of said fourth transistor.

13. The feed-forward amplifying device according to claim 12, wherein said fourth transistor comprises a GaAs FET.

14. The feed-forward amplifying device according to claim 12, wherein said auxiliary amplifier drive amplifier is formed as a variable gain type amplifier to correct the gain to a change in temperature of said auxiliary amplifier.

15. The feed-forward amplifying device according to claim 12, further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

16. The feed-forward amplifying device according to claim 12, wherein said auxiliary amplifier comprises a balanced-type amplifier using a hybrid, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

17. The feed-forward amplifying device according to claim 12, wherein said fourth transistor comprises a GaAs FET, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

18. The feed-forward amplifying device according to claim 12, wherein said auxiliary amplifier drive amplifier is formed as a variable gain type amplifier to correct the gain to a change in temperature of said auxiliary amplifier, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

19. The feed-forward amplifying device according to claim 12, further comprising:
a first voltage converter for converting a voltage from a primary power source into a voltage suitable for said main amplifier to provide a bias power source for said main amplifier, and
a second voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

20. The feed-forward amplifying device according to claim 12, further comprising:
a primary power source for supplying a voltage suitable for said main amplifier and said main amplifier drive amplifier to provide a bias power source for said main amplifier and said main amplifier drive amplifier; and a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

21. The feed-forward amplifying device according to claim 12, wherein said first transistor comprises one of a bipolar transistor and a MOSFET and wherein said second transistor comprises a GaAs FET, the feed-forward amplifying device further comprising:

a primary power source for supplying a voltage suitable for said main amplifier and said main amplifier drive amplifier to provide a bias power source for said main amplifier and said main amplifier drive amplifier; and a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

22. The feed-forward amplifying device according to claim 12, wherein said auxiliary amplifier comprises a balanced-type amplifier using a hybrid, the feed-forward amplifying device further comprising:

a primary power source for supplying a voltage suitable for said main amplifier and said main amplifier drive amplifier to provide a bias power source for said main amplifier and said main amplifier drive amplifier; and a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

23. The feed-forward amplifying device according to claim 12, wherein said fourth transistor comprises a GaAs FET, the feed-forward amplifying device further comprising:

a primary power source for supplying a voltage suitable for said main amplifier and said main amplifier drive amplifier to provide a bias power source for said main amplifier and said main amplifier drive amplifier; and a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

24. The feed-forward amplifying device according to claim 12, wherein said auxiliary amplifier drive amplifier is formed as a variable gain type amplifier to correct the gain to a chance in temperature of said auxiliary amplifier, the feed-forward amplifying device further comprising:

a primary power source for supplying a voltage suitable for said main amplifier and said main amplifier drive amplifier to provide a bias power source for said main amplifier and said main amplifier drive amplifier; and a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

25. The feed-forward amplifying device according to claim 12, further comprising:

a primary power source for supplying a voltage suitable for said main amplifier to provide a bias power source for said main amplifier; and a voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

26. The feed-forward amplifying device according to claim 1, wherein said auxiliary amplifier comprises a balanced-type amplifier using a hybrid, the feed-forward amplifying device further comprising:

a main amplifier drive amplifier disposed in the front stage of said main amplifier, said main amplifier drive amplifier including a third transistor and a third matching circuit disposed at at least one of the input side and output side of said third transistor;

an auxiliary amplifier drive amplifier disposed in the front stage of said auxiliary amplifier and formed of a fourth transistor of the same type as said third transistor and a fourth matching circuit disposed at at least one of the input side and output side of said fourth transistor;

a first voltage converter for converting a voltage from a primary power source into a voltage suitable for said main amplifier to provide a bias power source for said main amplifier, and a second voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

27. The feed-forward amplifying device according to claim 1, wherein said auxiliary amplifier comprises a balanced-type amplifier using a hybrid, the feed-forward amplifying device further comprising:

a main amplifier drive amplifier disposed in the front stage of said main amplifier, said main amplifier drive amplifier including a third transistor and a third matching circuit disposed at at least one of the input side and output side of said third transistor;

an auxiliary amplifier drive amplifier disposed in the front stage of said auxiliary amplifier and formed of a fourth transistor of the same type as said third transistor and a fourth matching circuit disposed at at least one of the input side and output side of said fourth transistor;

a primary power source for supplying a voltage suitable for said main amplifier to provide a bias power source for said main amplifier; and a voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

28. A feed-forward amplifying device comprising:

a distortion extracting loop circuit unit unit including:

a branching unit for branching a main signal in a main signal system, a main amplifier for amplifying the main signal branched by said branching unit, said main amplifier formed of a first transistor and a first matching circuit disposed of to at least one of the input side and output side of said first transistor, a first delaying unit for delaying the other main signal branched in said branching unit to different side from said main amplifier side, and a distortion extracted signal outputting unit for synthesizing a signal from said first delaying unit with a signal from said main amplifier and then outputting the result as a distortion extracted signal; and a distortion removing loop circuit unit including:

a second delaying unit for delaying the signal amplified by said main amplifier, an auxiliary amplifier, with a passage delay time shorter than that of said main amplifier, for amplifying the distortion extracted signal from said distortion extracted signal outputting unit, said auxiliary amplifier including a second transistor with an output smaller than that of said first transistor alone and a second matching circuit arranged to at least one of the input side and the output side of said second transistor, and a distortion component removing unit for synthesizing a signal from said auxiliary amplifier with a signal from said second delaying unit and then outputting the result as a main signal of which a distortion component is removed.

29. The feed-forward amplifying device according to claim 28, wherein said first transistor comprises a bipolar transistor or a MOSFET; and wherein said second transistor comprises a GaAs FET.

30. The feed-forward amplifying device according to claim 28, wherein said auxiliary amplifier comprises a balanced-type amplifier using a hybrid.

31. The feed-forward amplifying device according to claim 28, further comprising a first voltage converter for converting a voltage from a primary power source into a voltage suitable for said main amplifier to provide a bias power supply unit for said main amplifier and a second voltage converter for converting a voltage from said primary power source into a voltage suitable for said auxiliary amplifier to provide a bias power source for said auxiliary amplifier.

32. The feed-forward amplifying device according to claim 28, wherein said first transistor comprises one of a bipolar transistor and a MOSFET and said second transistor comprises a GaAs FET, the feed forward amplifying device further comprising a first voltage converter for converting a voltage from a primary power source into a voltage suitable for said main amplifier to provide a bias power source for said main amplifier and a second voltage converter for converting a voltage from said primary power source into a voltage suitable for said auxiliary amplifier to provide a bias power source for said auxiliary amplifier.

33. The feed-forward amplifying device according to claim 28, wherein said auxiliary amplifier comprises a balanced-type amplifier using a hybrid, the feed-forward amplifying device further comprising a first voltage converter for converting a voltage from a primary power source into a voltage suitable for said main amplifier to provide a bias power source for said main amplifier and a second voltage converter for converting a voltage from said primary power source into a voltage suitable for said auxiliary amplifier to provide a bias power source for said auxiliary amplifier.

34. The feed-forward amplifying device according to claim 28, further comprising a primary power source for supplying a voltage suitable for said main amplifier to provide a bias power source for said main amplifier and a voltage converter for converting a voltage from said primary power source into a voltage suitable for said auxiliary amplifier to provide a bias power source for said auxiliary amplifier.

35. The feed-forward amplifying device according to claim 28, wherein said first transistor comprises one of a bipolar transistor or a MOSFET and said second transistor comprises a GaAs FET, the feed-forward amplifying device further comprising a primary power source for supplying a voltage suitable for said main amplifier to provide a bias power source for said main amplifier and a voltage converter for converting a voltage from said primary power source into a voltage suitable for said auxiliary amplifier to provide a bias power source for aid auxiliary amplifier.

36. The feed-forward amplifying device according to claim 28, wherein said auxiliary amplifier comprises a balanced-type amplifier using a hybrid, the feed-forward amplifying device further comprising a primary power source for supplying a voltage suitable for said main amplifier to provide a bias power source for said main amplifier and a voltage converter for converting a voltage from said primary power source into a voltage suitable for said auxiliary amplifier to provide a bias power source for said auxiliary amplifier.

37. The feed-forward amplifying device according to claim 28, further comprising a main amplifier drive amplifier arranged in the front stage of said main amplifier, said main amplifier drive amplifier including a third transistor and a third matching circuit arranged to at least one of the input side and output side of said third transistor.

38. The feed-forward amplifying device according to claim 37, wherein said third transistor comprises a GaAs FET.

39. The feed-forward amplifying device according to claim 28, further comprising a main amplifier drive amplifier disposed in the front stage of said main amplifier, said main amplifier drive amplifier including a third transistor and a third matching circuit disposed at at least one of the input side and output side of said third transistor and an auxiliary amplifier drive amplifier disposed in the front stage of said auxiliary amplifier and formed of a fourth transistor of the same type as said third transistor and a fourth matching circuit disposed at at least one of the input side and output side of said fourth transistor.

40. The feed-forward amplifying device according to claim 39, wherein said fourth transistor comprises a GaAs FET.

41. The feed-forward amplifying device according to claim 39, wherein said auxiliary amplifier drive amplifier is formed as a variable gain type amplifier to correct the gain to a change in temperature of said auxiliary amplifier.

42. The feed-forward amplifying device according to claim 39, further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

43. The feed-forward amplifying device according to claim 39, wherein said first transistor comprises one of a bipolar transistor and a MOSFET and said second transistor comprises a GaAs FET, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

44. The feed-forward amplifying device according to claim 39, wherein said auxiliary amplifier comprises a balanced-type amplifier using a hybrid, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier and said auxiliary amplifier drive amplifier.

45. The feed-forward amplifying device according to claim 39, wherein said fourth transistor comprises a GaAs FET, the feed-forward amplifying device further comprising a first voltage converter for converting a voltage from a primary power source into a voltage suitable for said main amplifier and said main amplifier drive amplifier to provide a bias power supply unit for said main amplifier and said main amplifier drive amplifier, and a second voltage converter for converting a voltage from aid primary power source into a voltage suitable for said auxiliary amplifier and said auxiliary amplifier drive amplifier to provide a bias power source for said auxiliary amplifier and said auxiliary amplifier drive amplifier.

46. The feed-forward amplifying device according to claim 39, wherein said auxiliary amplifier drive amplifier is formed as a variable gain type amplifier to correct the gain to a change in temperature of said auxiliary amplifier, the feed-forward amplifying device further comprising a first voltage converter for converting a voltage from a primary power source into a voltage suitable for said main amplifier and said main amplifier drive amplifier to provide a bias power source for said main amplifier and said main amplifier drive amplifier, and a second voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

47. The feed-forward amplifying device according to claim 39, further comprising:
 a first voltage converter for converting a voltage from a primary power source into a voltage suitable for said main amplifier to provide a bias power source for said main amplifier, and
 a second voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

48. The feed-forward amplifying device according to claim 39, further comprising:
 a primary power source for supplying a voltage suitable for said main amplifier and said main amplifier drive amplifier to provide a bias power source for said main amplifier and said main amplifier drive amplifier; and
 a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

49. The feed-forward amplifying device according to claim 39, wherein said first transistor comprises one of a bipolar transistor and a MOSFET and said second transistor comprises a GaAs FET, the feed-forward amplifying device further comprising:
 a primary power source for supplying a voltage suitable for said main amplifier and said main amplifier drive amplifier to provide a bias power source for said main amplifier and said main amplifier drive amplifier; and
 a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

50. The feed-forward amplifying device according to claim 39, wherein said auxiliary amplifier comprises a balanced-type amplifier using a hybrid, the feed-forward amplifying devices further comprising:
 a primary power source for supplying a voltage suitable for said main amplifier and said main amplifier drive amplifier to provide a bias power source for said main amplifier and said main amplifier drive amplifier; and
 a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

51. The feed-forward amplifying device according to claim 39, wherein said fourth transistor comprises a GaAs FET, the feed-forward amplifying device further comprising:
 a primary power source for supplying a voltage suitable for said main amplifier and said main amplifier drive amplifier to provide a bias power source for said main amplifier and said main amplifier drive amplifier; and
 a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

52. The feed-forward amplifying device according to claim 39, wherein said auxiliary amplifier drive amplifier is formed as a variable gain type amplifier to correct the gain to a change in temperature of said auxiliary amplifier, the feed-forward amplifying device further comprising:
 a primary power source for supplying a voltage suitable for said main amplifier and said main amplifier drive amplifier to provide a bias power source for said main amplifier and said main amplifier drive amplifier; and
 a voltage converter for converting a voltage from said primary power source into a voltage suitable for said auxiliary amplifier and said auxiliary amplifier drive amplifier to provide a bias power source for said auxiliary amplifier and said auxiliary amplifier drive amplifier.

53. The feed-forward amplifying device according to claim 39, further comprising:

a primary power source for supplying a voltage suitable for said main amplifier to provide a bias power source for said main amplifier; and a voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

54. The feed-forward amplifying device according to claim 28, wherein said auxiliary amplifier comprises a balanced-type amplifier using a hybrid, the feed-forward amplifying device, further comprising:

a main amplifier drive amplifier disposed in the front stage of said main amplifier, said main amplifier drive amplifier including a third transistor and a third matching circuit disposed at at least one of the input side and output side of said third transistor;

an auxiliary amplifier drive amplifier disposed in the front stage of said auxiliary amplifier and formed of a fourth transistor of the same type as said third transistor and a fourth matching circuit disposed at at least one of the input side and output side of said fourth transistor;

a first voltage converter for converting a voltage from a primary power source into a voltage suitable for said main amplifier to provide a bias power source for said main amplifier, and a second voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

55. The feed-forward amplifying device according to claim 28, wherein said auxiliary amplifier comprises a balanced-type amplifier using a hybrid, the feed-forward amplifying device further comprising:

an auxiliary amplifier drive amplifier disposed in the front stage of said auxiliary amplifier and formed of a fourth transistor of the same type as said third transistor and a fourth matching circuit disposed at at least one of the input side and output side of said fourth transistor;

a main amplifier drive amplifier disposed in the front stage of said main amplifier, said main amplifier drive amplifier including a third transistor and a third matching circuit disposed at at least one of the input side and output side of said third transistor;

a primary power source for supplying a voltage suitable for said main amplifier to provide a bias power source for said main amplifier; and a voltage converter for converting a voltage from said primary power source into a voltage suitable for said auxiliary amplifier, said main amplifier drive amplifier and said auxiliary amplifier drive amplifier to provide a bias power source for said auxiliary amplifier, said main amplifier drive amplifier and said auxiliary amplifier drive amplifier.

56. A base station with a feed-forward amplifying device, said base station accommodating plural mobile stations, comprising:

a transmitting unit for amplifying and transmitting in common a signal including plural frequency components selected for each mobile station, in a frequency band used for transmitting signals to said mobile stations;

said transmitting unit including:

a distortion extracting loop circuit unit including a main amplifier which amplifies a main signal in a main signal system, said main amplifier including a first transistor and a first matching circuit disposed at at least one of the input side and the output side of said first transistor, said distortion extracted signal obtained by canceling a main signal component of an output from said main amplifier; and a distortion removing loop circuit unit including an auxiliary amplifier, with a passage delay time shorter than that of said main amplifier, which amplifies the distortion extracted signal from said distortion extracting loop circuit unit, said auxiliary amplifier including a second transistor which provides an output smaller than that of said first transistor and a second matching circuit disposed at at least one of the input side and the output side of said second transistor, said distortion removing loop circuit unit outputting only said main signal component from a signal in said main signal system at the rear stage of said main amplifier using the distortion extracted signal amplified by said auxiliary amplifier.

\* \* \* \* \*